United States Patent
Allen et al.

(10) Patent No.: US 12,198,838 B2
(45) Date of Patent: Jan. 14, 2025

(54) SEALED STRANDED GROUNDING WIRE ASSEMBLY

(71) Applicant: CommScope Technologies LLC, Hickory, NC (US)

(72) Inventors: Barry Wayne Allen, Siler City, NC (US); Mohamed Aznag, Scherpenheuvel (BE)

(73) Assignee: CommScope Technologies LLC, Hickory, NC (US)

( * ) Notice: Subject to any disclaimer, the term of this patent is extended or adjusted under 35 U.S.C. 154(b) by 155 days.

(21) Appl. No.: 17/749,566

(22) Filed: May 20, 2022

(65) Prior Publication Data

US 2022/0375652 A1    Nov. 24, 2022

Related U.S. Application Data

(60) Provisional application No. 63/336,380, filed on Apr. 29, 2022, provisional application No. 63/201,998, filed on May 21, 2021.

(51) Int. Cl.
| | | |
|---|---|---|
| H01B 9/00 | (2006.01) | |
| H01B 7/18 | (2006.01) | |
| H01R 4/66 | (2006.01) | |
| H01R 13/648 | (2006.01) | |
| H05K 7/14 | (2006.01) | |

(52) U.S. Cl.
CPC ........... *H01B 9/006* (2013.01); *H01B 7/1875* (2013.01); *H01R 4/66* (2013.01); *H01R 13/648* (2013.01); *H05K 7/1452* (2013.01)

(58) Field of Classification Search
CPC ........ H01B 9/006; H01B 7/1875; H01R 4/66; H01R 13/648; H05K 7/1452
See application file for complete search history.

(56) References Cited

U.S. PATENT DOCUMENTS

| | | | |
|---|---|---|---|
| 5,369,225 A | 11/1994 | Natwig et al. | |
| 6,046,406 A * | 4/2000 | Milanowski | H02G 15/013 |
| | | | 174/94 S |
| 6,677,529 B1 * | 1/2004 | Endacott | H01R 43/048 |
| | | | 174/DIG. 8 |
| 7,559,774 B2 | 7/2009 | Kowalczyk | |
| 8,023,793 B2 * | 9/2011 | Kowalczyk | G02B 6/44465 |
| | | | 385/100 |
| 9,614,304 B2 | 4/2017 | Melni | |

(Continued)

FOREIGN PATENT DOCUMENTS

| | | |
|---|---|---|
| EP | 0442941 B1 | 1/1995 |
| EP | 0587616 B1 | 7/1996 |

(Continued)

OTHER PUBLICATIONS

JP 2004119058 English Translation (Year: 2004).*
CN 109286108 A English Translation (Year: 2019).*

*Primary Examiner* — Pete T Lee
(74) *Attorney, Agent, or Firm* — Merchant & Gould P.C.

(57) ABSTRACT

A sealed stranded wire assembly includes one or more stranded wires. The one or more stranded wires includes a solid portion formed on or attached to the length of the one or more stranded wires. The solid portion prevents liquid, dust, or other contaminants from traveling along the length of the one or more stranded wires through voids within the one or more stranded wires.

43 Claims, 22 Drawing Sheets

(56) References Cited

U.S. PATENT DOCUMENTS

| | | |
|---|---|---|
| 9,719,614 B2 | 8/2017 | Blaser et al. |
| 10,483,660 B2 | 11/2019 | Liefsoens et al. |
| 2014/0284100 A1* | 9/2014 | Ichikawa ............ B60R 16/0215 174/70 R |

FOREIGN PATENT DOCUMENTS

| | | |
|---|---|---|
| WO | 2014005916 A2 | 1/2014 |
| WO | 2014095462 A1 | 6/2014 |
| WO | 2019219827 A1 | 11/2021 |

* cited by examiner

SEALED STRANDED GROUNDING WIRE ASSEMBLY

CROSS-REFERENCE TO RELATED APPLICATIONS

This application is being filed on May 20, 2022 and claims the benefit of U.S. Patent Application Ser. No. 63/336,380, filed on Apr. 29, 2022 and claims the benefit of U.S. Patent Application Ser. No. 63/201,998, filed on May 21, 2021, the disclosures of which are incorporated herein by reference in their entireties.

BACKGROUND

Telecommunications systems typically employ a network of telecommunications cables capable of transmitting large volumes of data and voice signals over relatively long distances. The telecommunications cables can include fiber optic cables, electrical cables, or combinations of electrical and fiber optic cables. A typical telecommunications network also includes a plurality of telecommunications enclosures integrated throughout the network of telecommunications cables. The telecommunications enclosures are adapted to house and protect telecommunications components such as splices, termination panels, power splitters and wavelength division multiplexers.

It is often preferred for the telecommunications enclosures to be re-enterable. The term "re-enterable" means that the telecommunications enclosures can be reopened to allow access to the telecommunications components housed therein without requiring the removal and destruction of the telecommunications enclosures. For example, certain telecommunications enclosures can include separate access panels that can be opened to access the interiors of the enclosures, and then closed to re-seal the enclosures. Other telecommunications enclosures take the form of elongated sleeves formed by wrap-around covers or half-shells having longitudinal edges that are joined by clamps or other retainers. Still other telecommunications enclosures include two half-pieces that are joined together through clamps, wedges or other structures.

Telecommunications enclosures are typically sealed to inhibit the intrusion of moisture or other contaminants. Pressurized gel-type seals have been used to effectively seal the locations where telecommunications cables enter and exit telecommunications enclosures. Example pressurized gel-type seals are disclosed by document EP 0442941 B1 and document EP 0587616 B1. Both of these documents disclose gel-type cable seals that are pressurized through the use of threaded actuators. Document U.S. Pat. No. 6,046,406 discloses a cable seal that is pressurized through the use of an actuator including a cam lever. PCT Patent Publication Nos. WO 2014/095462 and WO 2014/005916 disclose enclosures having gel blocks with individually removable gel sealing modules.

Telecommunications enclosures may be grounded to protect internal components from power surges or electrical charges from the cables entering and exiting the enclosures. Grounding devices may be provided to ground the internal components to an exterior of the enclosure. Improvements are desired.

SUMMARY

One aspect of the present invention relates to a grounding wire assembly including a stranded wire having a stranded conductive core and an insulating jacket covering at least a portion of the stranded conductive core. The grounding wire assembly has a first end and a second end. The insulating jacket covers at least a portion of the stranded core between the first and second ends and the first end has an exposed end of the stranded conductive core. The grounding wire assembly further includes a solid wire portion having a first end and second end. The solid wire is conductive and has an exposed conductive outer surface portion.

In one example, the first end of the stranded grounding wire is conductively attached to the second end of the solid wire, and a seal is provided over the first end of the stranded grounding wire and the second end of the solid wire.

In one example, the solid wire and the exposed end of the stranded conductive core are positioned in opposite ends of a tubular conductive member having opposite open ends. The tubular conductive member is conductively attached to the exposed end of stranded conductive core of the stranded wire and to the solid wire, thereby forming an electrical connection between the stranded conductive core and the solid wire.

In one example, a sleeve of protective non-conductive tubing, such as heat shrink tubing, is positioned over the tubular conductive member. The sleeve extends a first length over a portion of the exposed conductive outer surface portion of the solid wire and a second length over a portion of the insulating jacket of the stranded wire. The sleeve forms a seal around the tubular conductive member, the first length over the solid wire, and the second length over the insulating jacket of the stranded wire.

Another aspect of the present invention relates to a telecommunications enclosure including an enclosure that includes a housing. The housing includes a gel sealing block or other seal to provide a sealed pathway for cables to pass between the enclosure and an exterior environment. In certain embodiments a plurality of cables pass through the gel sealing block. A stranded grounding wire assembly having a stranded grounding wire with a conductive core and an insulating jacket is routed through the gel sealing block, with a first end of the stranded grounding wire extending to the exterior environment. A second end of the stranded grounding wire is conductively attached to a mounting position inside the housing.

In one example, the stranded grounding wire is conductively attached at a second end to the cable inside the housing; a solid wire having a first end and second end, where the solid wire is conductive, and the solid wire has an exposed conductive outer surface portion. The first end of the stranded grounding wire is conductively attached to the second end of the solid wire, and a second seal is provided over the first end of the stranded grounding wire and the second end of the solid wire, the second seal positioned in the exterior environment.

In one example, the first end of the grounding wire assembly is sealed substantially as described above, by positioning an exposed length of the conductive core and a length of a solid wire in opposite ends of a tubular conductive member having opposing open ends. As described above, a sleeve of heat shrink tubing is positioned over the tubular conductive member. The sleeve extends a first length over a portion of the exposed conductive outer surface portion of the solid wire and a second length over a portion of the insulating jacket of the stranded wire. The sleeve forms a seal around the tubular conductive member, the first length over the solid wire, and the second length over the insulating jacket of the stranded wire. In certain embodiments, a coating of heat activated adhesive may be included on the interior surface of the sleeve, which may further enhance the seal.

Another aspect of the present invention relates to a grounding wire assembly. The grounding wire assembly comprises a first length of stranded wire having a first end and a second end. The first length of stranded wire has a stranded conductive core. The grounding wire assembly further comprises a second length of wire. The second length of wire has a first end and second end. The second length of wire has a conductive core. The grounding wire assembly further comprises a solid conductive portion having opposite ends. The first end of the first length of stranded wire and the second end of the second length of wire each contact opposite ends of the solid conductive portion. The solid conductive portion is conductively attached to the stranded conductive core of the first length of stranded wire and to the conductive core of the second length of wire. The grounding wire assembly further comprises a seal extending over the solid portion, the seal also extends a first length over a portion of the second length of wire, the seal also extends a second length over a portion of the length of stranded wire. The seal forms a sealed connection around the solid portion, the first length of the second wire, and the second length of the stranded wire.

Another aspect of the present invention relates to a telecommunications enclosure. The telecommunications enclosure comprises an enclosure including a housing. The housing includes a gel sealing block. The gel sealing block provides an environmentally sealed pathway for cable to pass between the enclosure and an exterior environment. The telecommunications enclosure further comprises at least one cable passing through the gel sealing block. The telecommunications enclosure further comprises a length of stranded wire routed within the enclosure for grounding the enclosure. The length of stranded wire has a stranded conductive core and is conductively attached at a second end to a mounting position inside the housing. The telecommunications enclosure further comprises a second length of wire having a first end and second end. The second length of wire is conductive. The second length of wire has a conductive core. The telecommunications enclosure also has a solid conductive portion having opposite ends. The first end of the length of stranded wire and the second end of the second length of wire each contact opposite ends of the solid conductive portion. The solid conductive portion is conductively attached to the stranded conductive core of the length of stranded wire and to the conductive core of the second length of wire. The telecommunications enclosure further comprises a seal over the solid portion, the seal extends a first length over a portion of the length of stranded wire. The seal also extends a second length over a portion of the second length of wire. The seal forms a sealed connection around the solid portion, the first length of the length of stranded wire, and the second length of the second length of wire Another aspect of the present invention relates to a telecommunications enclosure. The telecommunications enclosure comprises an enclosure including a housing including a gel sealing block. The gel sealing block provides an environmentally sealed pathway for cable to pass between the enclosure and an exterior environment. The telecommunications enclosure further comprises at least one cable passing through the gel sealing block. The telecommunications enclosure further comprises a length of stranded wire routed within the enclosure for grounding the enclosure. The length of stranded wire has a stranded conductive core and is conductively attached at a second end to a mounting position inside the housing. The telecommunications enclosure further comprises a second length of wire having a first end and second end, the second length of wire is conductive. The second length of wire has a conductive core. The telecommunications enclosure further comprises a solid conductive portion having opposite ends. The first end of the length of stranded wire and the second end of the second length of wire each contact opposite ends of the solid conductive portion. The solid conductive portion is conductively attached to the stranded conductive core of the length of stranded wire and to the conductive core of the second length of wire. The telecommunications enclosure further comprises a seal over the solid portion, the seal extends a first length over a portion of the length of stranded wire, the seal also extends a second length over a portion of the second length of wire. The seal forms a sealed connection around the solid portion, the first length of the length of stranded wire, and the second length of the second length of wire.

Another aspect of the present invention relates to a telecommunications enclosure. The telecommunications enclosure comprises an enclosure including a housing that includes a gel sealing block. The gel sealing block provides an environmentally sealed pathway for cable to pass between the enclosure and an exterior environment. The telecommunications enclosure further comprises at least one cable passing through the gel sealing block. The telecommunications enclosure further comprises a length of stranded grounding wire routed within the enclosure. The length of stranded grounding wire has a stranded conductive core and is conductively attached at a second end to a mounting position inside the housing. The second length of wire has a first end and second end. The second length of wire is conductive and has a conductive core. The telecommunications enclosure further comprises a solid conductive portion having opposite ends. The first end of the length of stranded grounding wire and the second end of the second length of wire each contact opposite ends of the solid conductive portion, wherein the solid conductive portion is conductively attached to the stranded conductive core of the length stranded grounding wire and to the conductive core of the second length of wire. The solid conductive portion is positioned within the gel sealing block, the gel sealing block forms a seal around the solid portion.

Another aspect of the present invention relates to a grounding wire assembly. The grounding wire assembly comprises a first length of stranded wire having a first end and a second end. The first length of stranded wire has a stranded conductive core with voids arranged between the strands. The grounding wire assembly further comprises a second length of stranded wire having a first end and second end, the second length of stranded wire has a stranded conductive core with voids arranged between the strands. The grounding wire assembly further comprises a middle length of stranded wire positioned between the first length of stranded wire and the second length of stranded wire, the middle length of stranded wire has a stranded conductive core with blocking material that fills the voids between the strands. The first end of the first length of stranded wire and the second end of the second length of wire each contact opposite ends of the middle portion. The middle portion is conductively attached to the stranded conductive core of the first length of stranded wire and to the stranded conductive core of the second length of wire.

Another aspect of the present invention relates to a grounding wire assembly. The grounding wire assembly comprises a first length of stranded wire having a first end and a second end. The first length of stranded wire has a stranded conductive core with voids arranged between the strands. The grounding wire assembly further comprises a second length of stranded wire having a first end and second end, the second length of stranded wire has a stranded conductive core with voids arranged between the strands. The grounding wire assembly further comprises a tubular conductive member having opposite open ends. The first end of the first length of stranded wire and the second end of the second length of stranded wire each are positioned in opposite open ends of the tubular conductive member. The tubular conductive member is conductively attached to the first length of stranded wire and the second length of stranded wire.

DETAILED DESCRIPTION

Figure 1:
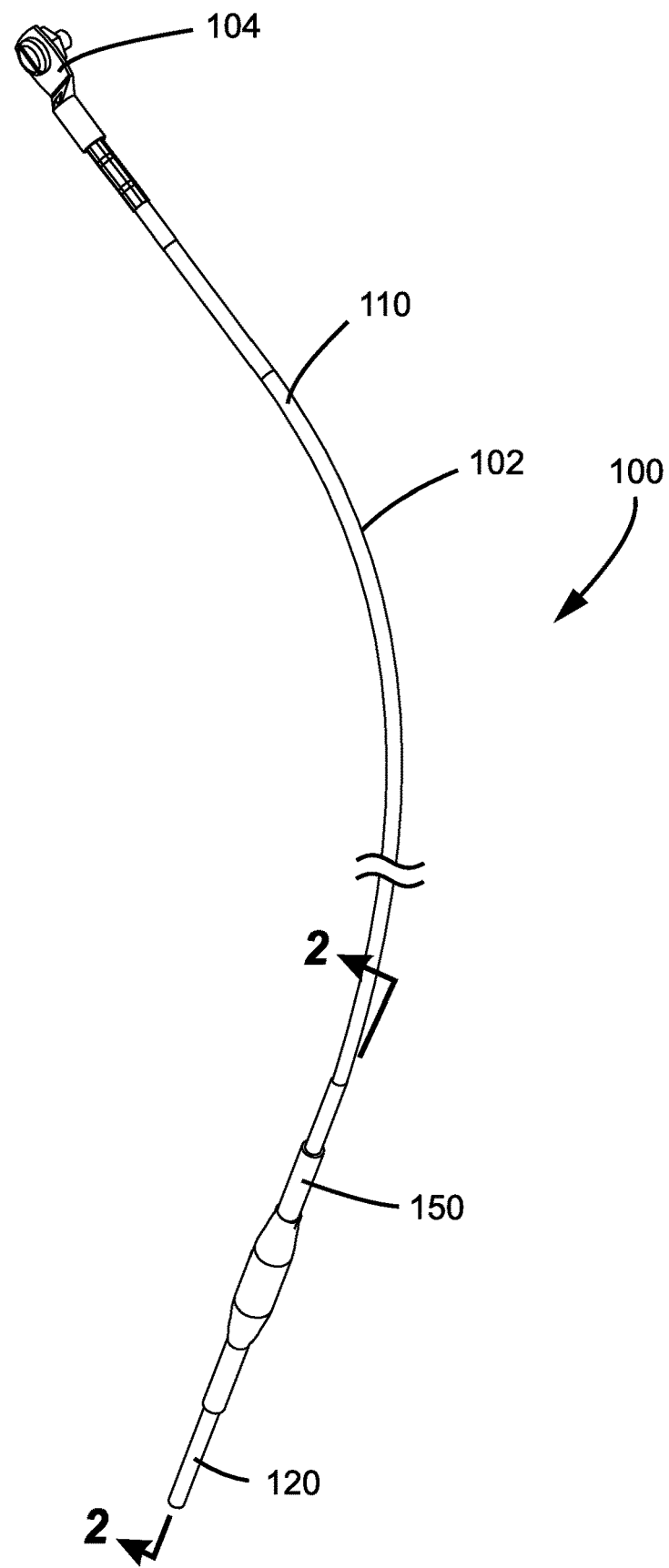
FIG. 1 is a perspective view of one embodiment of a sealed stranded wire in accordance with the principles of this disclosure.

Turning now to FIG. 1, one embodiment of a sealed stranded wire assembly 100 in accordance with the principles of the invention is shown. Sealed stranded wire assembly 100 provides a flexible portion that may be easily routed within enclosures or other suitable locations and is sealed at an exposed end to prevent liquid, dust, or other contaminants from entering into the wire. In the embodiment shown, sealed stranded wire assembly 100 is a grounding wire used in telecommunications enclosures, but it may alternatively be used in other environments where it is desirable to use flexible wire, but environmental conditions exist where contaminants are likely to migrate into a stranded wire if an end of the wire is exposed.

Figure 2:
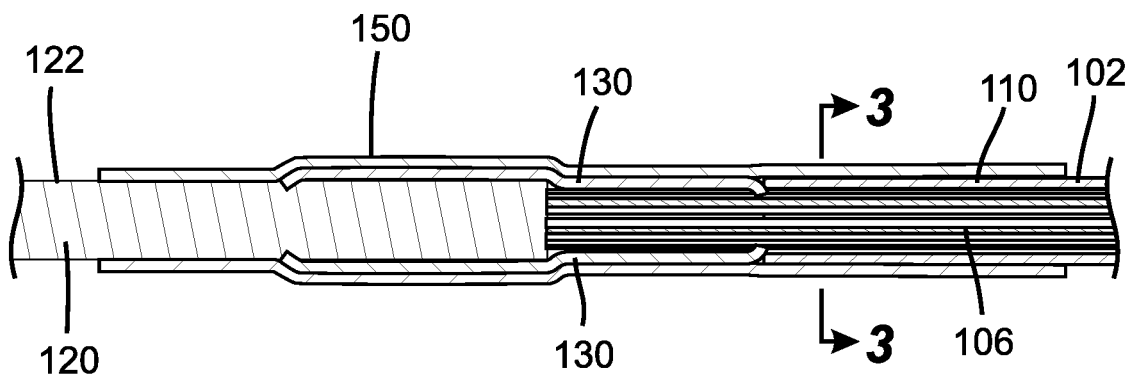
FIG. 2 is a partial section view of the sealed stranded wire of FIG. 1, taken generally along the line 2-2 in FIG. 1.
Figure 3:
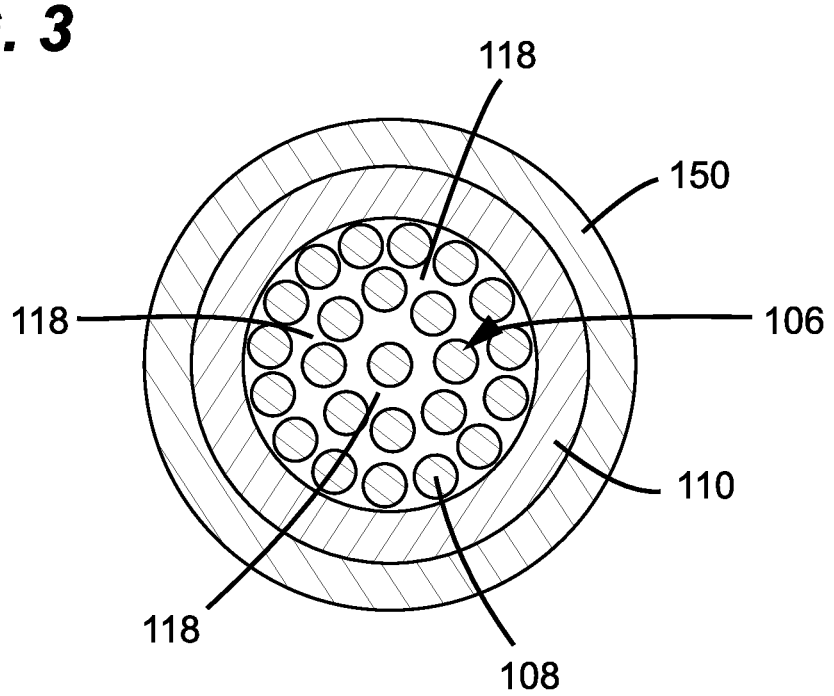
FIG. 3 is a section view of the sealed stranded wire of FIG. 1, taken generally along the line 3-3 in FIG. 2.

In the embodiment shown, sealed stranded wire assembly 100 includes a length of stranded wire 102 terminated at a first end by an eyelet 104 and terminated at a second end by a length of solid wire 120. As shown in FIGS. 2-3, stranded wire 102 includes a stranded conductive core 106 made of a plurality of individual strands of, typically copper, wire 108. At least a portion of the stranded conductive core 106 is covered by an insulating jacket 110, typically made of flexible PVC or nylon. As shown, a portion of the insulating jacket 110 is removed at a second end of the sealed stranded wire assembly 100, thereby exposing a length of the stranded conductive core 106.

As shown in FIG. 3, the individual strands of wire 108 are bundled together within the insulating jacket 110. By bundling small gauge strands of wire 108, stranded wire 102 is flexible, allowing it to be easily routed in and through relatively small spaces. However, bundling a plurality of individual strands of wire 108 creates gaps or voids 118 between the individual strands and between the individual strands and the insulating jacket 110. In certain embodiments, the voids 118 could provide a pathway for water, dust, or other contaminants to enter the stranded wire 102. In the embodiment shown, a length of solid wire 120 that has a similar diameter to the stranded conductive core 106 is conductively attached to the second end of stranded conductive core 106. In the embodiment shown, solid wire 120 has an exposed conductive outer surface 122. In certain embodiments, portions of solid wire 120 may be disposed within an insulating jacket without departing from the principles of this disclosure.

As shown, one end of the solid wire 120 and the second end of stranded wire 102 are positioned inside a tubular conductive member 130. To position the solid wire 120 and stranded wire 102 inside tubular conductive member 130, a user inserts each into opposite ends of the tubular conductive member. To prepare the second end of stranded wire 102 for positioning inside tubular conductive member 130, a portion of the insulating jacket 110 is stripped off of the stranded conductive core 106, thereby exposing the core. In the embodiment shown, tubular conductive member 130 is crimped onto the solid wire 120 and stranded wire 102. In alternative embodiments, tubular conductive member 130 may be conductively attached to the solid wire 120 and stranded wire 102 by solder or any other suitable structure. In certain embodiments, solid wire 120 physically contacts stranded wire 102 when the wires are positioned inside the tubular conductive member 130.

Solder only or other conductive connections can be used between the solid wire 120 and stranded conductive core 106 of stranded wire 102.

A seal 150, such as a sleeve of heat shrink tubing is positioned over the tubular conductive member 130. The seal 150 extends a first length over a portion of the exposed conductive outer surface 122 of solid wire 120. The seal 150 also extends a second length over a portion of the insulating jacket 110 of stranded wire 102. The seal 150 forms a sealed connection around the tubular conductive member 130, the solid wire 120, and the insulating jacket 110 of stranded wire 102. The seal 150 is made of any suitable heat shrink tubing and, in certain embodiments, may include an adhesive coating on the interior of the heat shrink tubing sleeve to enhance the seal. In some embodiments, the adhesive is a heat activated adhesive, such as a hot melt.

The sealed connection around conductive outer surface 122 of solid wire 120 is an environmental seal, such as to prevent water entry to an interior of stranded wire 102. The sealed connection around insulating jacket 110 of stranded wire 102 is also an environmental seal, such as to prevent water entry to an interior of stranded wire 102.

Attaching a length of solid wire 120 to the second end of stranded wire 102 with tubular conductive member 130 and positioning the seal 150 around all three components seals the end of stranded wire 102 and eliminates any pathway for liquid, dust, or other contaminants to enter the voids 118 around the individual strands of wire 108 in the stranded wire 102, and then possibly into the interior of an enclosure or other device the sealed stranded wire assembly 100 is used with. The solid wire 120 provides a desirable structure to connect to for creating the ground pathway from the enclosure or other device.

Other seals over the interface between the stranded wire 102 and the solid wire 120 can be used, such as potting, or a holt melt, with or without an outer protective tubing to keep water or other elements from passing through insulating jacket 110.

Figure 4:
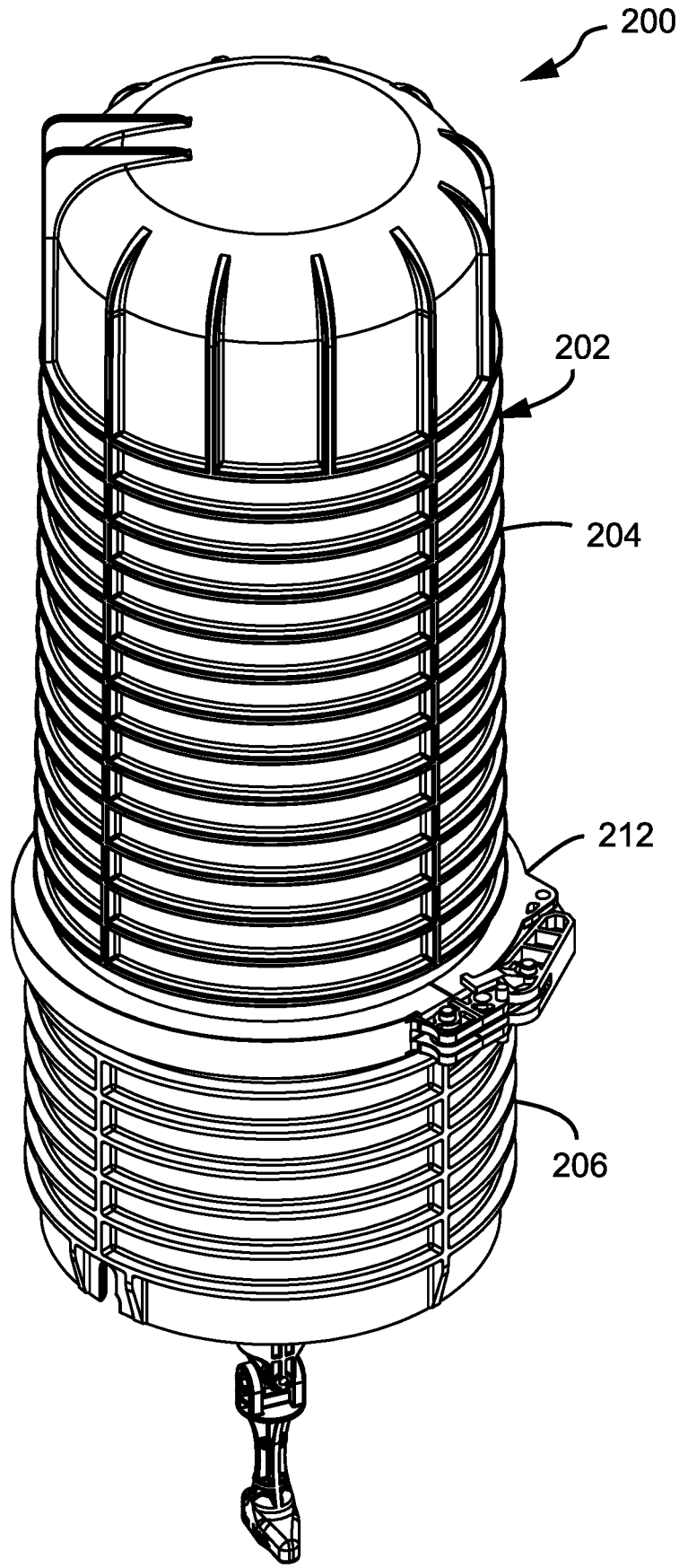
FIG. 4 is a perspective view of one embodiment of a telecommunications enclosure in accordance with the principles of this disclosure.
Figure 5:
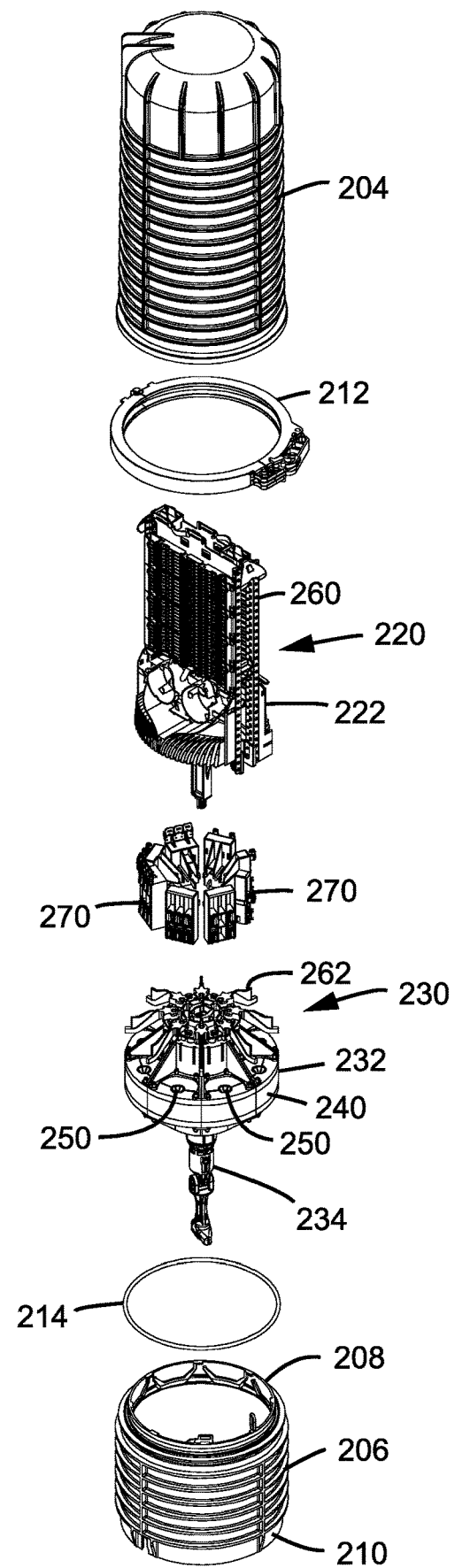
FIG. 5 is an exploded view of the telecommunications enclosure of FIG. 4.
Figure 6:
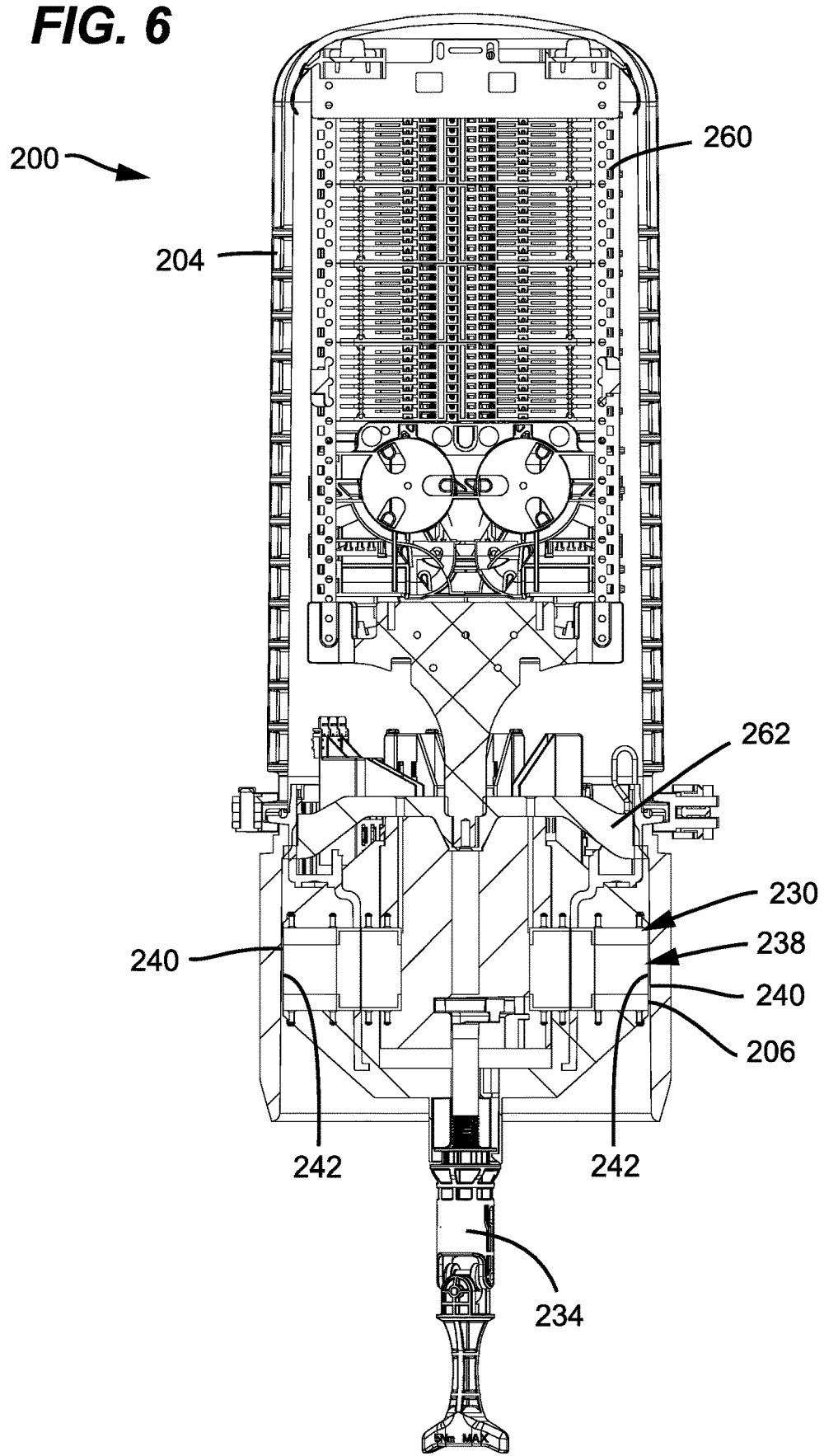
FIG. 6 is a cross-sectional view of the telecommunications enclosure of FIG. 4.
Figure 7:
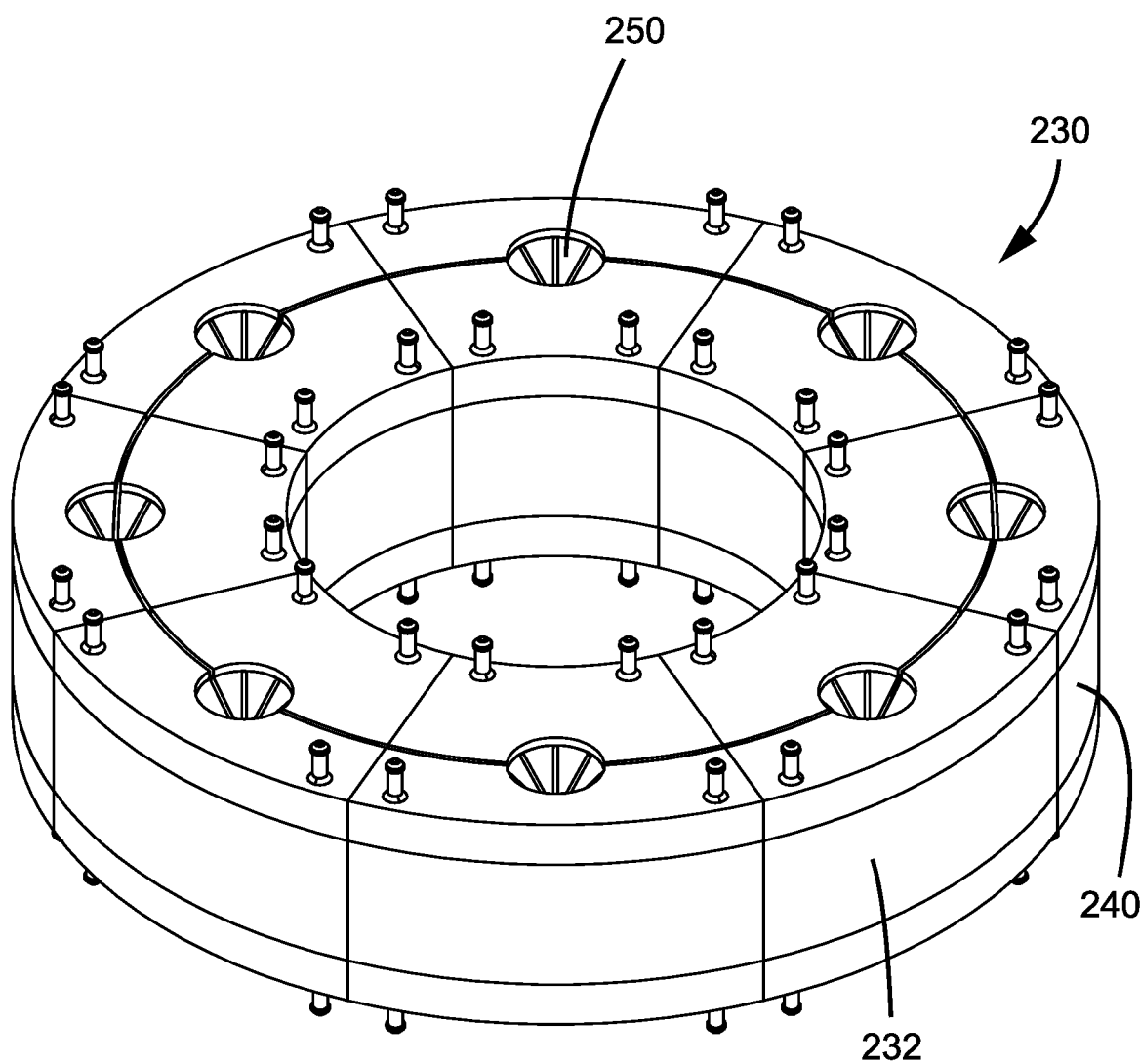
FIG. 7 is a perspective view of one embodiment of a gel sealing block used to seal the telecommunications enclosure of FIG. 4.

FIGS. 4-6 show one embodiment of a telecommunications enclosure 200 including a housing 202. In one example, the housing 202 includes a dome 204 that attaches to a base 206. The base 206 can include a first end 208 adapted for connection to the dome 204 and a second end 210. In one example, the first end 208 can connect to the dome 204 by a clamp 212. An environmental seal 214, such as an O-ring, can be provided between the base 206 and the dome 204 to provide environmental sealing. As shown in FIGS. 5-6, a telecommunications assembly unit 220 is housed within the housing 202. The telecommunications assembly unit 220 includes a fiber optic manager 222 coupled to a gel sealing unit 230. The gel sealing unit 230, shown in greater detail in FIG. 7, includes a gel sealing block 232 that mounts within an actuator 234. When the telecommunications assembly unit 220 is housed within the housing 202, the gel sealing block 232 fits within the base 206, and the fiber optic manager 222 is enclosed within the dome 204.

Once the gel sealing block 232 is within the base 206, the gel sealing block 232 can be axially compressed by the actuator 234 to provide sealing. Sealing can include sealing of any cables 300 (see FIG. 10) routed through the cable ports 250 defined by the gel sealing block 232, and can also include peripheral sealing 238 defined between a radially outwardly facing gel surface 240 of the gel sealing block 232 and a radially inwardly facing surface 242 of the base 206. As will be described, sealing also includes sealing each of the sealed stranded wire assemblies 100, as they pass from an interior of the enclosure 200 to an exterior. The sealing similarly occurs in a gel sealing block 232, including a cable port 250. Cable ports 250 whether for cables 300 or sealed stranded wire assemblies 100 define generally linear pathways.

Fiber optic manager 222 includes a fiber management tower 260 capable of pivotally supporting a plurality of fiber management trays (not shown). The fiber management tower 260 couples to an anchoring bracket 262 that may be locked or fixed within an interior of the base 206. When the anchoring bracket 262 is fixed relative to the base 206, the anchoring bracket 262 is prevented from axially moving relative to the base 206. The anchoring bracket 262 can also be coupled to the gel sealing unit 230. Thus, the anchoring bracket 262 can provide structure for axially fixing/supporting the entire telecommunications assembly unit 220 within the interior of the housing 202.

In certain examples, cable anchoring units 270 can be mounted on the gel sealing unit 230 and/or to the anchoring bracket 262. Cable anchoring units 270 may vary in size and configuration to be compatible with cables of different sizes and types routed through the gel sealing unit 230. In certain embodiments, cable anchoring units 270 may be mounted directly to the anchoring bracket 262. It will be appreciated that the anchoring bracket 262 can include snap-fit structures, hooks, tabs, rails, slot openings, or other structures for allowing adapters and/or cable anchoring structures and/or adapters to be readily attached to the anchoring bracket.

Figure 8:
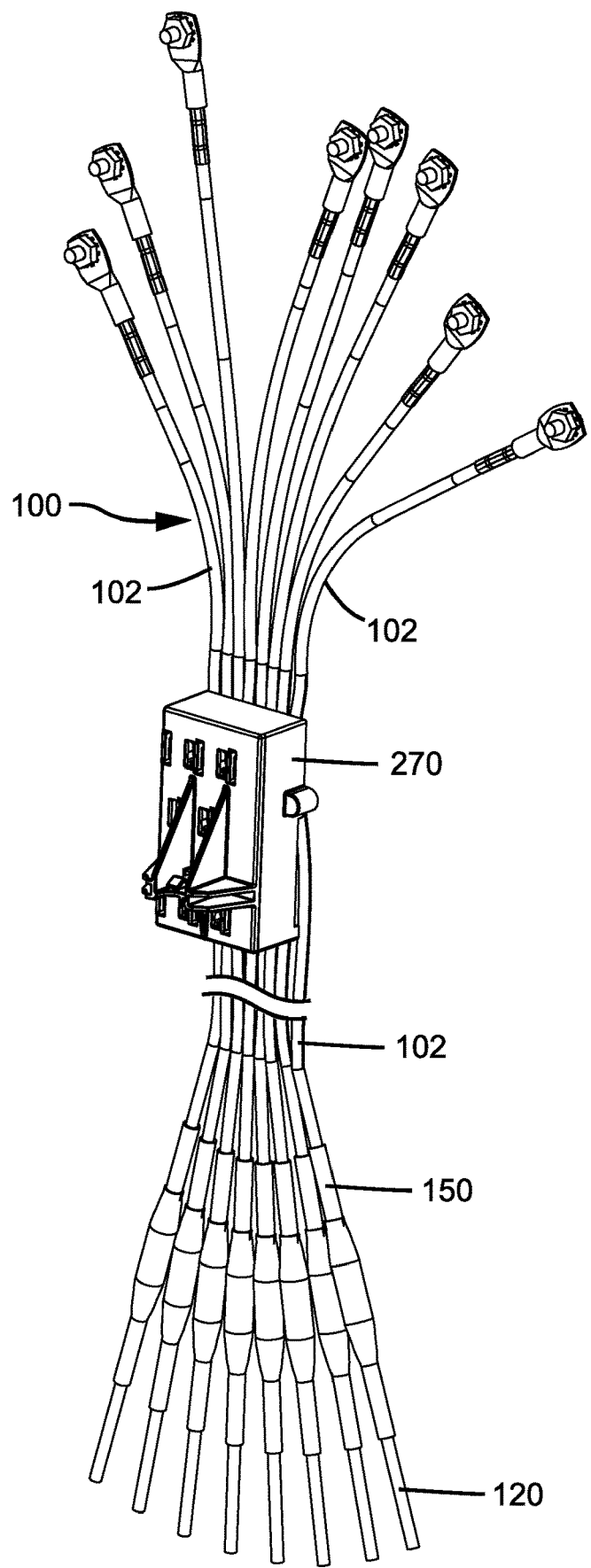
FIG. 8 is a perspective view of a plurality of sealed stranded wires passing through a cable anchoring unit for use in the telecommunications enclosure of FIG. 4.
Figure 9:
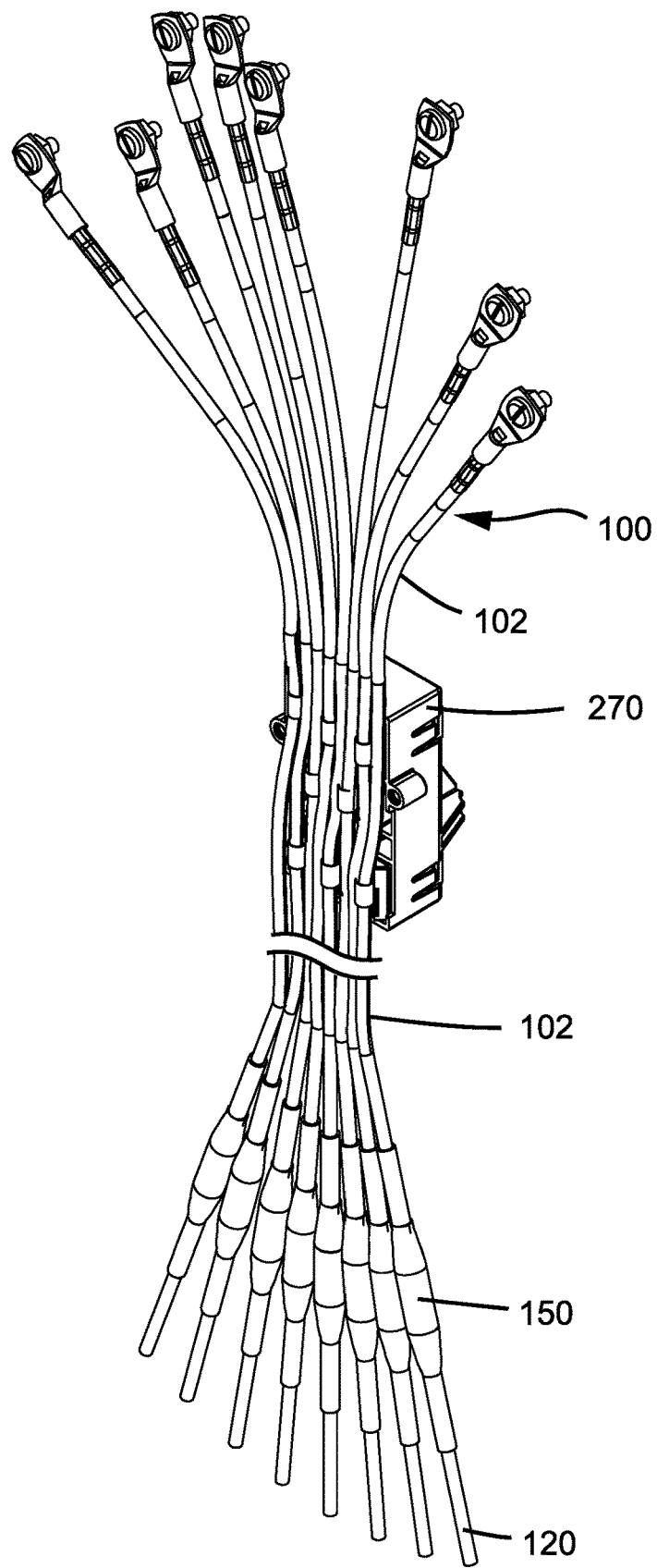
FIG. 9 is another perspective view of a plurality of sealed stranded wires passing through a cable anchoring unit for use in the telecommunications enclosure of FIG. 4.

FIGS. 8-9 show one embodiment of a cable anchoring unit 270 with a plurality of sealed stranded wire assemblies 100, as described above, routed through the cable anchoring unit. As shown, sealed stranded wire assemblies 100 include flexible portions of stranded wire 102 that are routed through the cable anchoring unit 270 and conductively attached to a mounting position, such as a conductive frame, inside housing 202.

Figure 10:
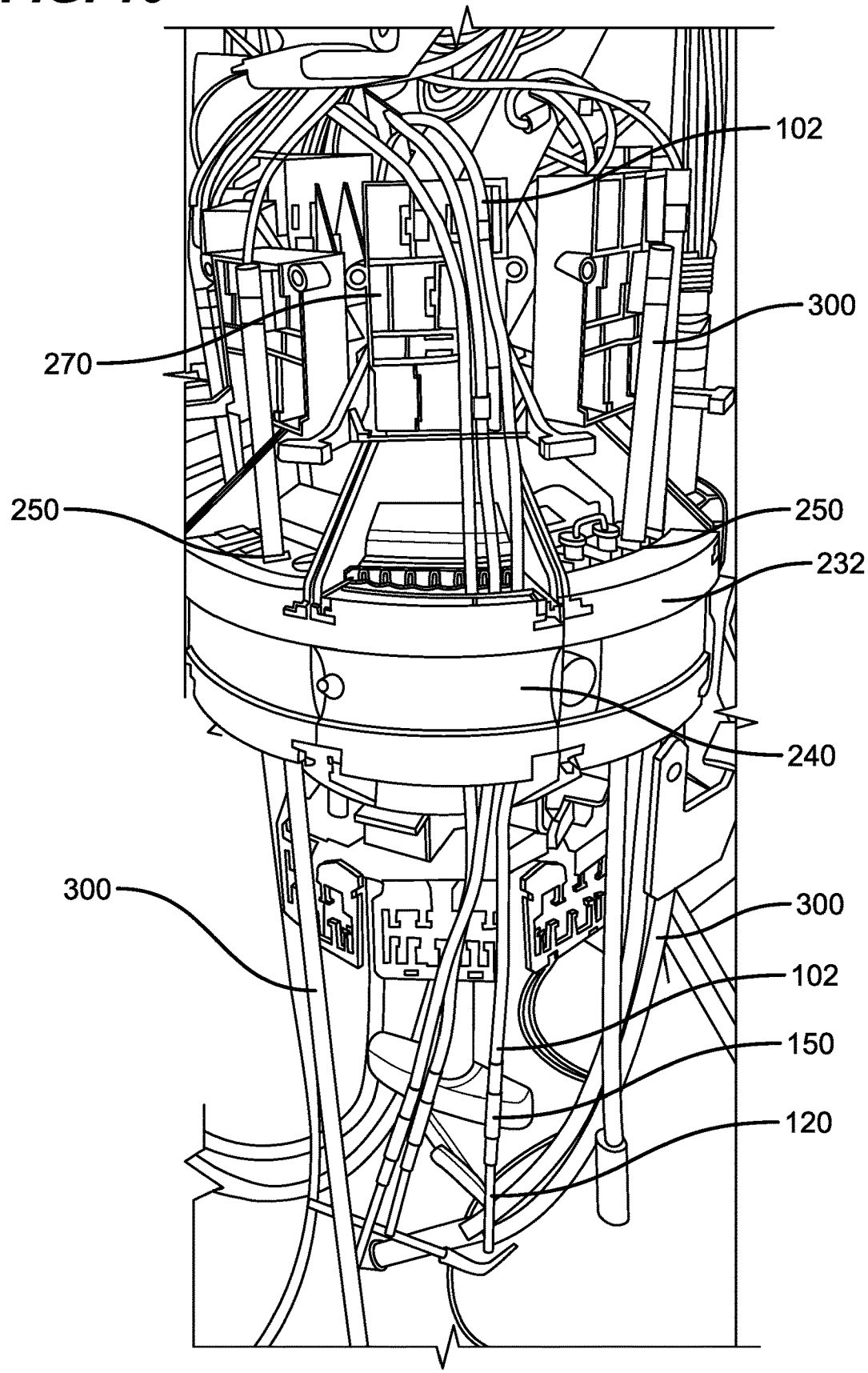
FIG. 10 is a photograph showing a plurality of sealed stranded wires routed through a cable anchoring unit and a gel sealing block of a telecommunications enclosure, showing the wires having sealed ends positioned outside the enclosure.

As shown in FIG. 10, the flexible portions of stranded wire 102 then pass through the gel sealing block 232 to the exterior environment, where the length of solid wire 120, tubular conductive member 130, and seal 150 are attached to the end of the stranded wire 102, outside of the enclosure.

FIG. 10 also shows a plurality of cables 300 passing through cable ports 250 of gel sealing unit 230. Cables 300 can include feeder cables, drop cables, branch cables, distribution cables and/or through-cables in/out of the enclosure 200.

In the example shown, the telecommunications enclosure 200 includes the sealed stranded wire assemblies 100 routed internally and then through a gel sealing block 232. The stranded wire portions are advantageously used within the telecommunications enclosures because they are relatively flexible when compared to solid wires of similar gauge. This is useful for routing within the enclosures and for developing a good seal through the gel sealing block. Adding the solid wire provides a good contact structure for connecting to grounding pathways in the exterior of the enclosure, such a clamp held by a fastener. Positioning the solid wire only in the exterior of the enclosure is advantageous in that the sold wire may be more difficult to route in often tight spaces in the interior of the enclosure. Also, the solid wire may become bent in an area of the gel sealing block, where there may be a linear sealing pathway, thus increasing the chances that a leak path may be provided through the gel sealing block.

Enclosure 200 may include a single sealed stranded wire assembly 100, or multiple. In the case of multiple, the sealed stranded wire assemblies can be used to trace or tone individual cables if such separation of the cables and the wire assemblies is maintained within enclosure 200.

Enclosure 200 may include a cable that is opened to access the fibers. In that case, the conductive path of the cable may be broken. The sealed stranded wire assemblies 100 can be used to bond these to ground also.

Because enclosure 200 is sealed and so are the sealed stranded wire assemblies 100, any pressure inside of enclosure 200, such as for testing, will be maintained.

Other seals besides the gel sealing unit 230 may be used, such as rubber seals, gaskets, O-rings, or glands around the cables and/or the sealed stranded wire assemblies 100.

Referring back to FIG. 2, in some embodiments, a seal is placed over the tubular conductive member 130. In some embodiments, the seal 150 is a sleeve of heat shrink tubing. In some embodiments, the seal 150 is positioned over the tubular conductive member 130 by sliding a heat shrink tubing sleeve onto either the solid wire 120 or the stranded wire 102 before the solid wire 120 and stranded wire 102 are joined together. The heat shrink tubing sleeve is initially slid onto the wire and positioned away from the connection point between the solid wire 120 and the stranded wire 102. Once the connection between the solid wire 120 and stranded wire 102 is formed, the heat shrink sleeve is slid over the connection. The heat shrink sleeve is then recovered so that it wraps tightly and seals around a portion of the solid wire 120, a portion of the stranded wire 102, and the connection point.

In some embodiments the use of the heat shrink sleeve to seal the connection between the solid wire 120 and the stranded wire 102 provides several benefits. For example, heat shrink sleeve can reduce the chances of a leak within the connection between the stranded wire 102 and the conductive member 130 that could allow moisture to be carried through the voids 118 in the stranded wire 102.

In some embodiments, increasing the length of the seal 150 formed by the heat shrink sleeve may be desirable. For example, in some embodiments, providing a longer length heat shrink sleeve could provide a longer bond line between the seal 150 and the solid wire 120 and the stranded wire 102. The longer bond line may provide an enhanced seal 150 that could eliminate the need for an adhesive coating on the interior of the heat shrink sleeve. Similarly, the longer bond line may also allow for a thinner walled heat shrink sleeve to be used.

In some embodiments, no heat shrink sleeve is provided on the length of solid wire 120, stranded wire 102, or tubular conductive member 130. In some embodiments, rather than provide heat shrink, a seal 150 in the form of a plastic dip coat is used to seal the solid wire 120, stranded wire 102, and tubular conductive member 130. Like the heat shrink sleeve, the plastic dip coat can provide a seal 150 to the sealed stranded wire assembly 100 and eliminate any pathway for liquid, dust, or other contaminants to enter the voids 118 around the individual strands of wire 108 in the stranded wire 102. In some examples, the plastic dip coating also provides an insulating layer to the sealed stranded wire assembly 100.

In some embodiments, no seal 150 is provided on the length of solid wire 120, stranded wire 102, or tubular conductive member 130.

Figure 11:
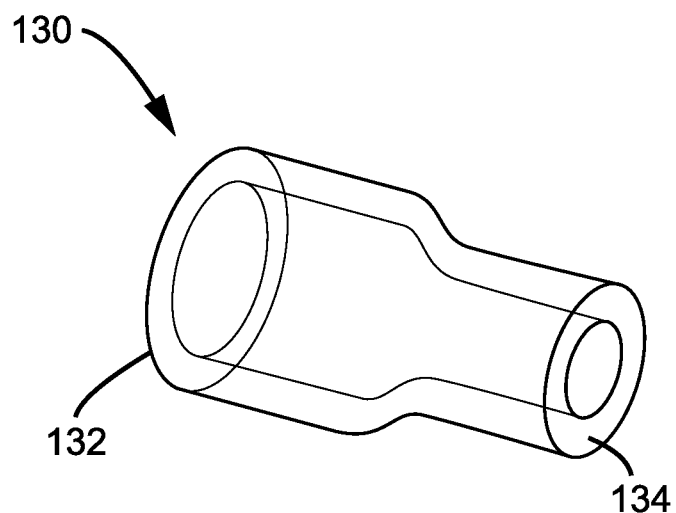
FIG. 11 is a perspective view of one embodiment of a tubular conductive member in accordance with the principles of the present disclosure.
Figure 12:
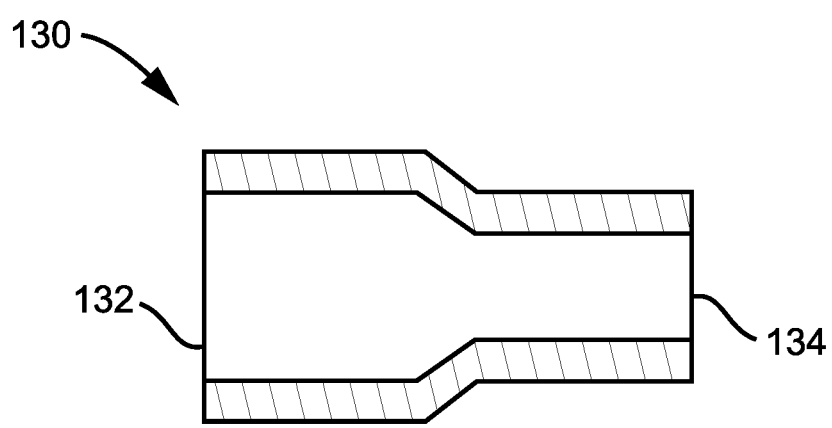
FIG. 12 is a cross-sectional view of the tubular conductive member of FIG. 11.

FIGS. 11 and 12 show an example tubular conductive member 130 that can be used to connect a solid wire 120 and stranded wire 102. The example tubular conductive member includes a first end 132 and a second end 134. In some embodiments, the first end 132 of the tubular conductive member 130 has a larger diameter than the second end 134. In some examples, the stranded wire 102 is inserted into an opening at the first end 132 and the solid wire 120 is inserted into an opening at the second end 134. In some examples, the first end 132 is sized to accommodate a #6AWG braided wire, and the second end 134 is sized to accommodate a #6AWG solid wire.

Figure 13:
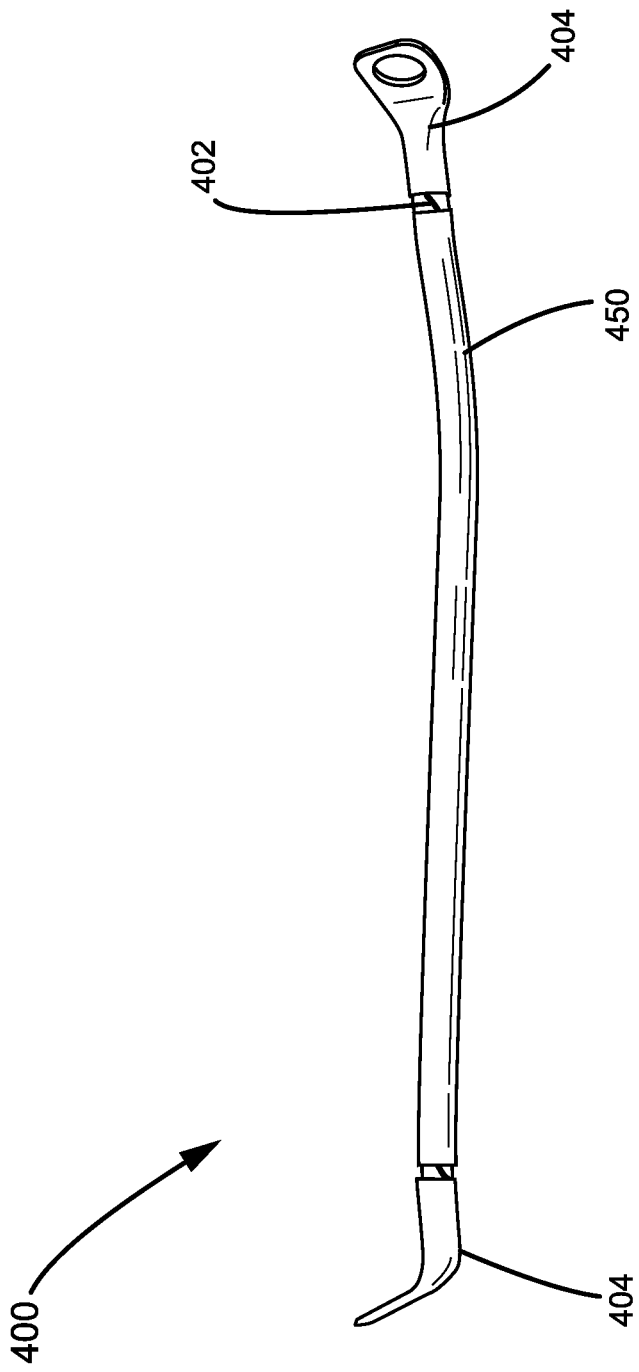
FIG. 13 is a side view of another embodiment of a sealed stranded wire in accordance with the principles of the present disclosure.

FIG. 13 shows an alternative embodiment of a sealed stranded wire assembly 400. In the example of FIG. 13, the sealed stranded wire assembly 400 includes a length of stranded wire 402. In some examples, such as the example of FIG. 13, the length of stranded wire 402 is terminated at each end by an eyelet 404. In some examples, the length of stranded wire 402 is substantially similar to the length of stranded wire 102, as described with reference to FIGS. 1-3 and can be, for example, a bundle of wires that are twisted or braided together. In some examples, such as the example of FIG. 13, the sealed stranded wire assembly 400 includes a seal 450 such as a heat shrink sleeve wrapped around the stranded wire 402. However, in other examples, the seal 450 is a plastic dip coating that can be used in place of a heat shrink sleeve.

Figure 14:
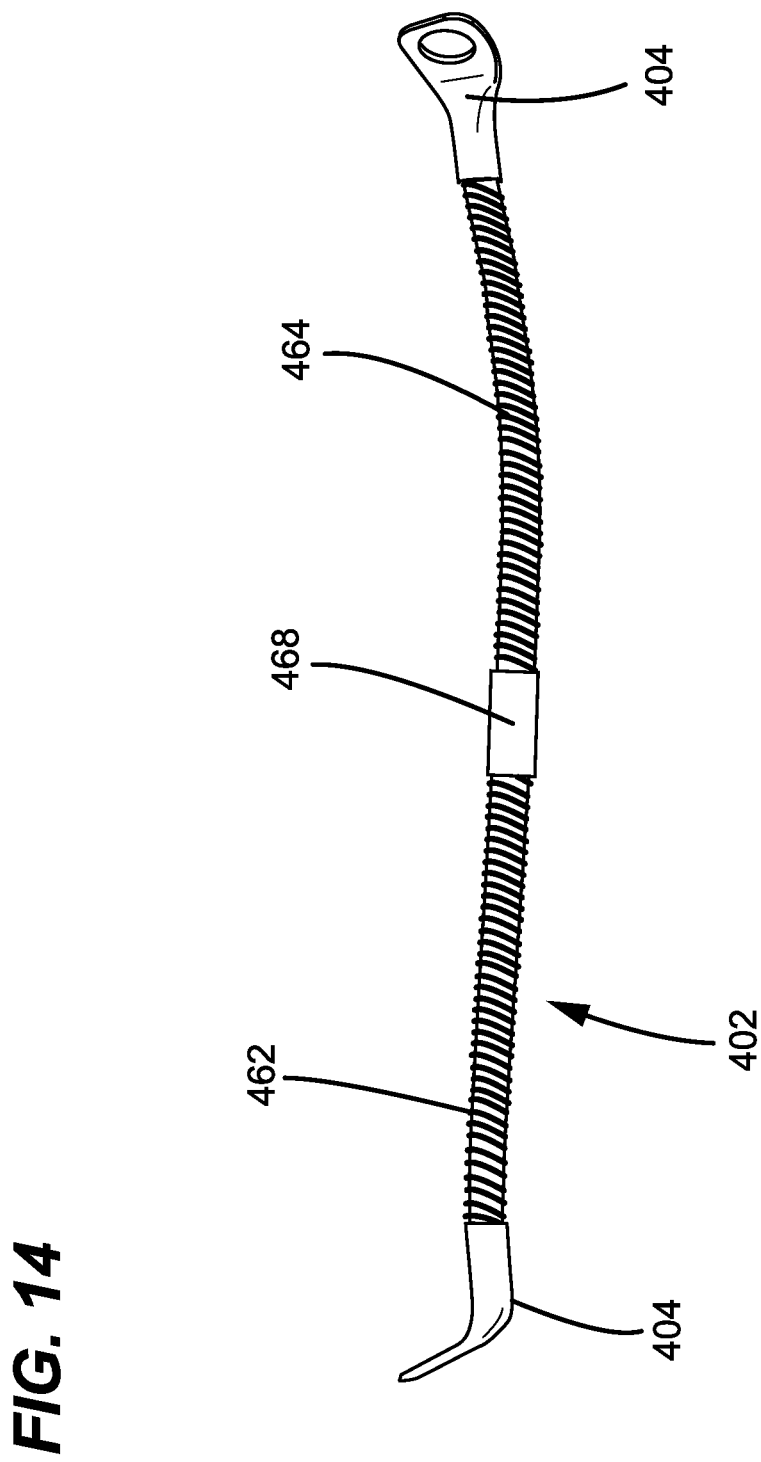
FIG. 14 is a side view of the sealed stranded wire of FIG. 13 with the sleeve removed.

FIG. 14 shows the length of stranded wire 402 of the sealed stranded wire assembly 400 of FIG. 13 with the seal 450 removed. In the example of FIG. 14, the stranded wire 402 includes a first stranded portion 462, a second stranded portion 464, and a solid portion 468. In some examples, the solid portion 468 is arranged between the first stranded portion 462 and the second stranded portion 464.

In some examples, the solid portion 468 is formed on a length of stranded wire 402 by applying a blocking material to a length of the stranded wire 402. In some examples, the blocking material is applied along a length of the stranded wire 402 in a range from about 10 mm to about 25 mm (or from 10 mm to 25 mm). In some examples, the application of the blocking material to the length of stranded wire 402 fills the voids 118 of the stranded wire 402 and blocks any pathway for liquid, dust, or other contaminants to travel along the length of the stranded wire 402. In some examples, the blocking material is solder. In some examples, the solder is applied to the length of stranded wire 402 by melting solder with a soldering iron and applying the solder to a length of the stranded wire 402 so that the solder flows into the voids 118 within the stranded wire 402. In other examples, the blocking material is a low viscosity polymer, grease, or adhesive. In some examples, more than one solid portion 468 is arranged along the length of stranded wire 402.

When applied to the length of stranded wire 402, the solid portion 468 prevents contaminates that enter the voids 118 of the first stranded portion 462 from spreading along the length of the stranded wire 402 into the second stranded portion 464.

As noted above with reference to FIG. 13, after the solid portion 468 is applied to the length of stranded wire 402, a seal 450 may be applied along the stranded wire 402. In some examples, the seal 450 is applied along the entire length of the stranded wire 402. In other examples, the seal 450 is applied along a portion of the length of the stranded wire 402. For example, the seal 450 may be applied only along a first stranded portion 462 of the stranded wire 402 or only along a second stranded portion 464 of the stranded wire 402. In other examples, the diameter of the sealed stranded wire assembly 400 is smaller at the solid portion 468. In some examples, the diameter of the sealed stranded wire assembly 400 is relatively constant along the length of the sealed stranded wire assembly 400. Such examples can be beneficial, as the connection between the two different portions does not substantially increase the diameter of the sealed stranded wire assembly 400. In other examples, the diameter of the sealed stranded wire assembly 400 is greater at the solid portion 468 due to the presence of the blocking material on the length of stranded wire 402, which increases the diameter of the stranded wire 402 at the solid portion 468. In other examples, the presence of the blocking material does not substantially increase the diameter of the sealed stranded wire assembly 400 at the solid portion 468. In these examples, additional material may be added around the length of stranded wire 402 at the solid portion 468 under the seal 450 to indicate the location of the solid portion once the seal 450 is applied over the length of stranded wire 402.

In some examples, the sealed stranded wire assembly 400 is used with an enclosure 200 to prevent liquid, dust, or other contaminants from traveling along the stranded wire 402 into the interior of the enclosure 200.

Figure 15:
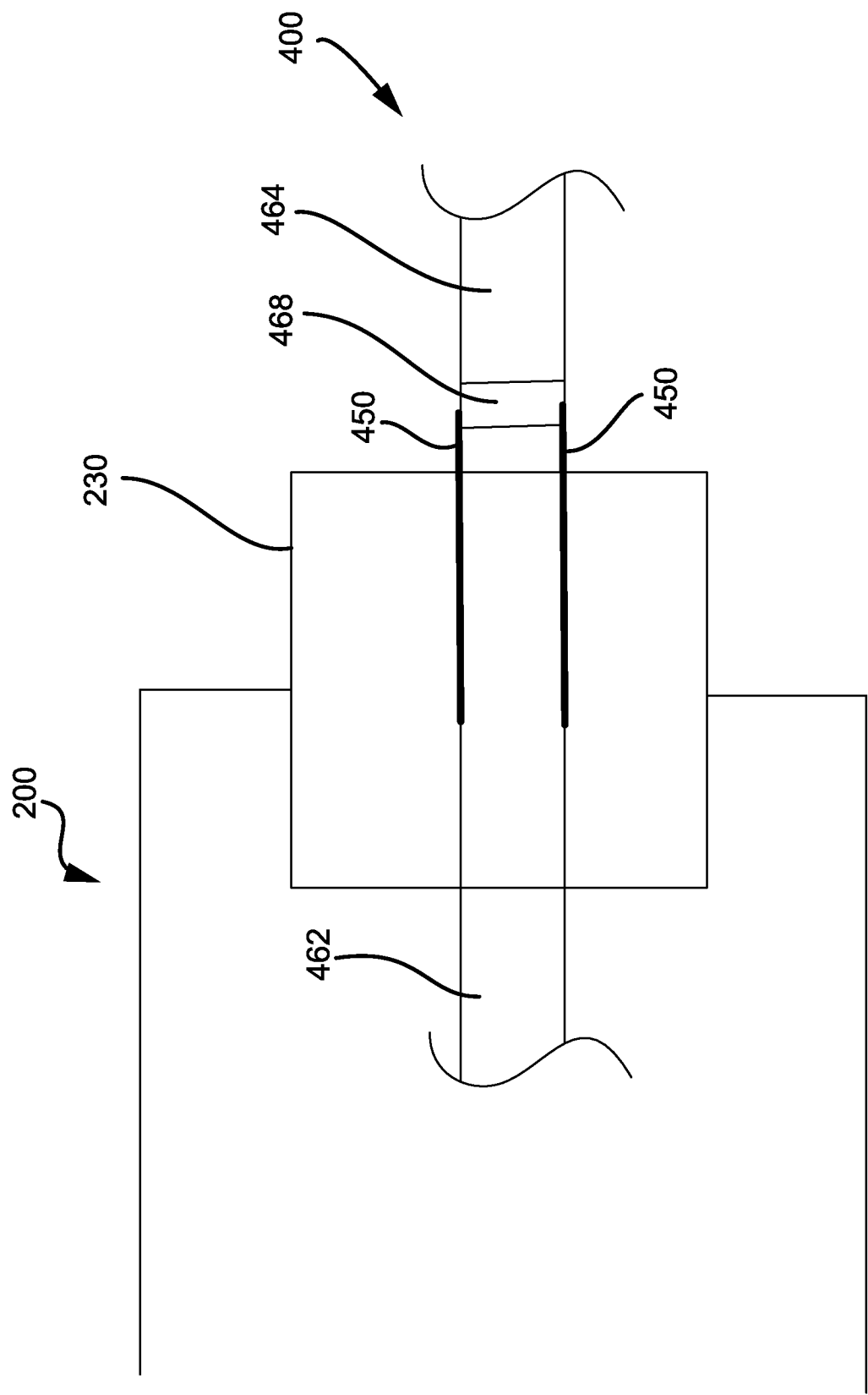
FIG. 15 is a diagram of a telecommunications enclosure with a sealed stranded wire routed through a gel sealing unit.

FIG. 15 shows an example sealed stranded wire assembly 400 that is routed into an enclosure 200 through a gel sealing unit 230. In the example of FIG. 15, the sealed stranded wire assembly 400 is routed straight through the gel sealing unit 230 so that the first stranded portion 462 of the sealed stranded wire assembly 400 extends from the outside of the enclosure 200, through the gel sealing unit 230, and into the enclosure 200. In the example of FIG. 15, the solid portion 468 is positioned outside of the enclosure 200 adjacent to the gel sealing unit 230 and stops moisture from traveling along the second stranded portion 464 into the first stranded portion 462, thereby preventing it from traveling from the outside of the enclosure 200 into the enclosure 200.

In the example of FIG. 15, the sealed stranded wire assembly 400 is shown with seal 450 included along a portion of the length of the sealed stranded wire assembly 400. In some examples, the seal 450 is provided along the entire length of the sealed stranded wire assembly. In other examples, the seal 450 is provided along less than the entire length of the sealed stranded wire assembly. In some examples, when configured in the orientation of FIG. 15, the seal is only provided along the sealed stranded wire assembly 400 along the first stranded portion 462 between the solid portion 468 and where the gel sealing unit 230 forms a seal with the sealed stranded wire assembly 400.

Figure 16:
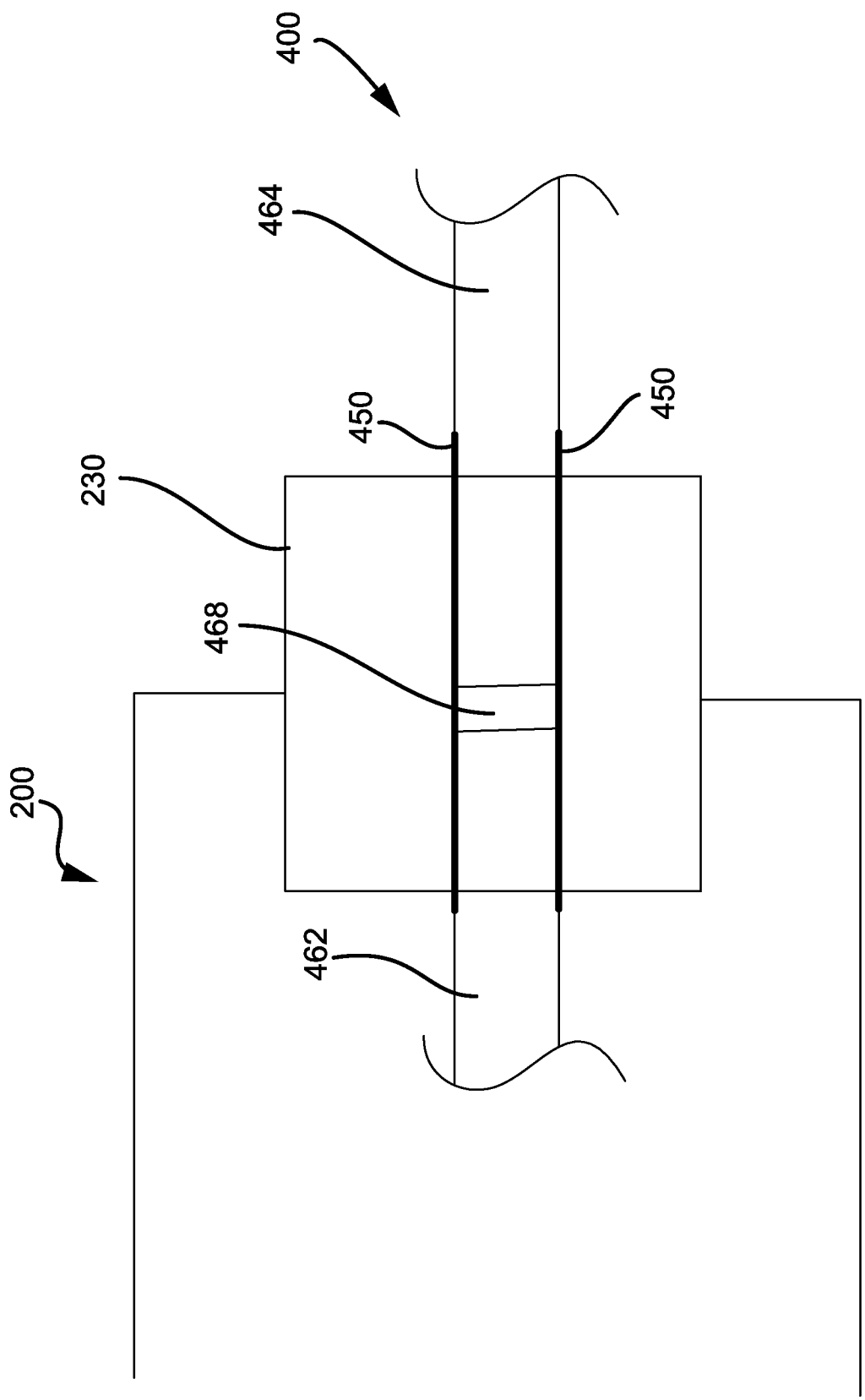
FIG. 16 is another diagram of a telecommunications enclosure with a sealed stranded wire routed through a gel sealing unit.

FIG. 16 shows another example sealed stranded wire assembly 400 that is routed into an enclosure 200 through a gel sealing unit 230. In the example of FIG. 16, the sealed stranded wire assembly 400 is routed straight through the gel sealing unit 230 so that the first stranded portion 462 of the sealed stranded wire assembly 400 extends within the enclosure 200 and terminates within the gel sealing unit 230. The solid portion 468 is positioned within the gel sealing unit 230 and stops moisture from traveling from outside of the enclosure 200 along the second stranded portion 464 and into the enclosure 200.

In the example of FIG. 16, the sealed stranded wire assembly 400 is shown with seal 450 included along a portion of the length of the sealed stranded wire assembly 400. In some examples, the seal 450 is provided along the entire length of the sealed stranded wire assembly. In other examples, the seal 450 is provided along less than the entire length of the sealed stranded wire assembly. In some examples, when configured in the orientation of FIG. 16, no seal 450 is provided.

Figure 17:
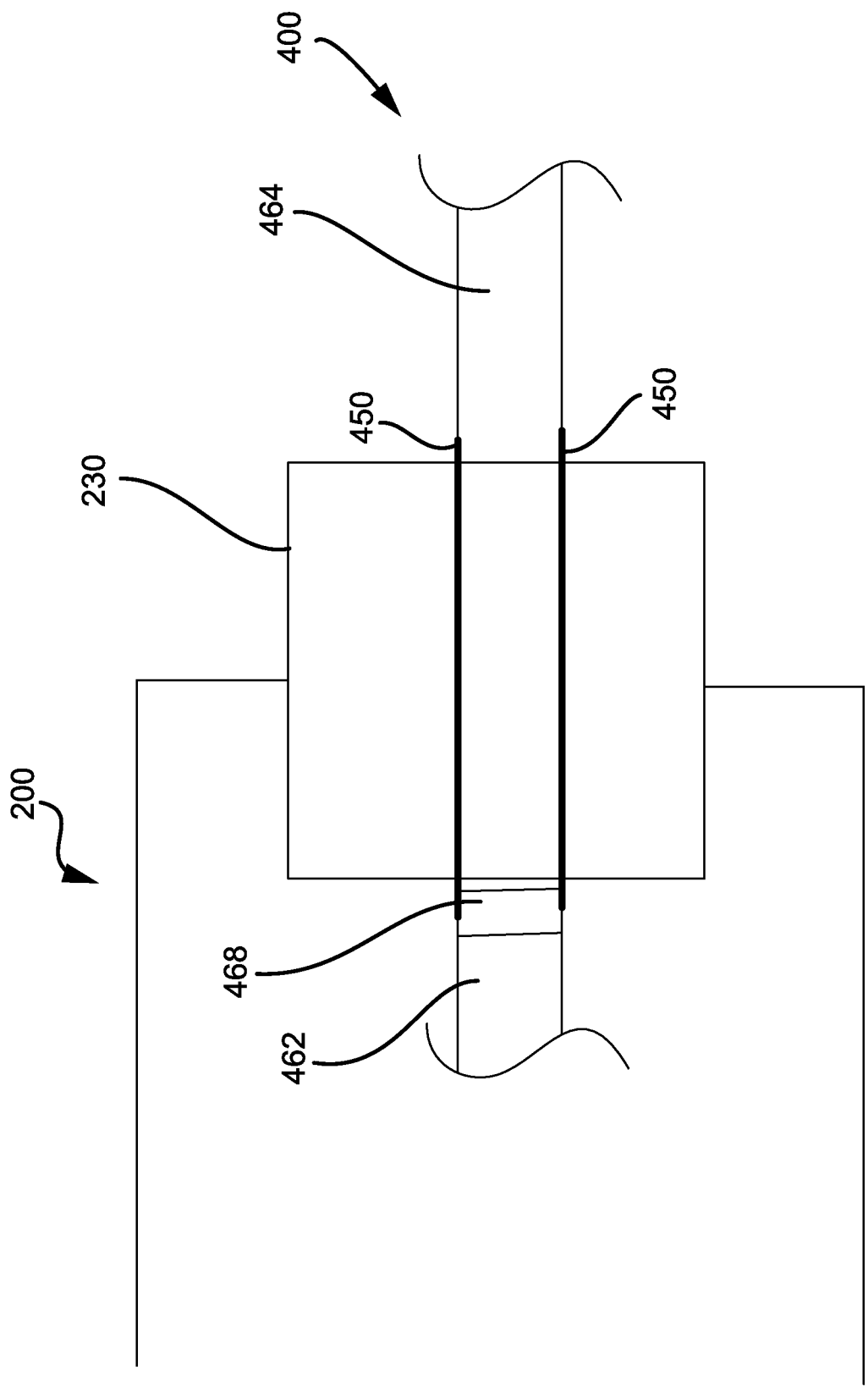
FIG. 17 is a further diagram of a telecommunications enclosure with a sealed stranded wire routed through a gel sealing unit.

FIG. 17 shows another example sealed stranded wire assembly 400 that is routed into an enclosure 200 through a gel sealing unit 230. In the example of FIG. 17, the sealed stranded wire assembly 400 is routed straight through the gel sealing unit 230 so that the first stranded portion 462 of the sealed stranded wire assembly 400 extends within the enclosure 200 and terminates within enclosure 200 adjacent to the gel sealing unit 230. The solid portion 468 is positioned within the enclosure 200 and stops moisture from traveling along the stranded wire 402 further into the enclosure 200.

In the example of FIG. 17, the sealed stranded wire assembly 400 is shown with seal 450 included along a portion of the length of the sealed stranded wire assembly 400. In some examples, the seal 450 is provided along the entire length of the sealed stranded wire assembly. In other examples, the seal 450 is provided along less than the entire length of the sealed stranded wire assembly. In some examples, when configured in the orientation of FIG. 17, the seal is only provided along the sealed stranded wire assembly 400 along the second stranded portion 464 between the solid portion 468 and where the gel sealing unit 230 forms a seal with the sealed stranded wire assembly 400.

As noted above, in some examples, the sealed stranded wire assembly 400 includes multiple solid portions 468 that are placed in combination along the length of the sealed stranded wire assembly 400. In these examples, the multiple solid portions 468 can be oriented in different positions with respect to the gel sealing unit 230 so that one or more of the configurations of FIGS. 15-17 can be used together in one assembly.

Figure 18:
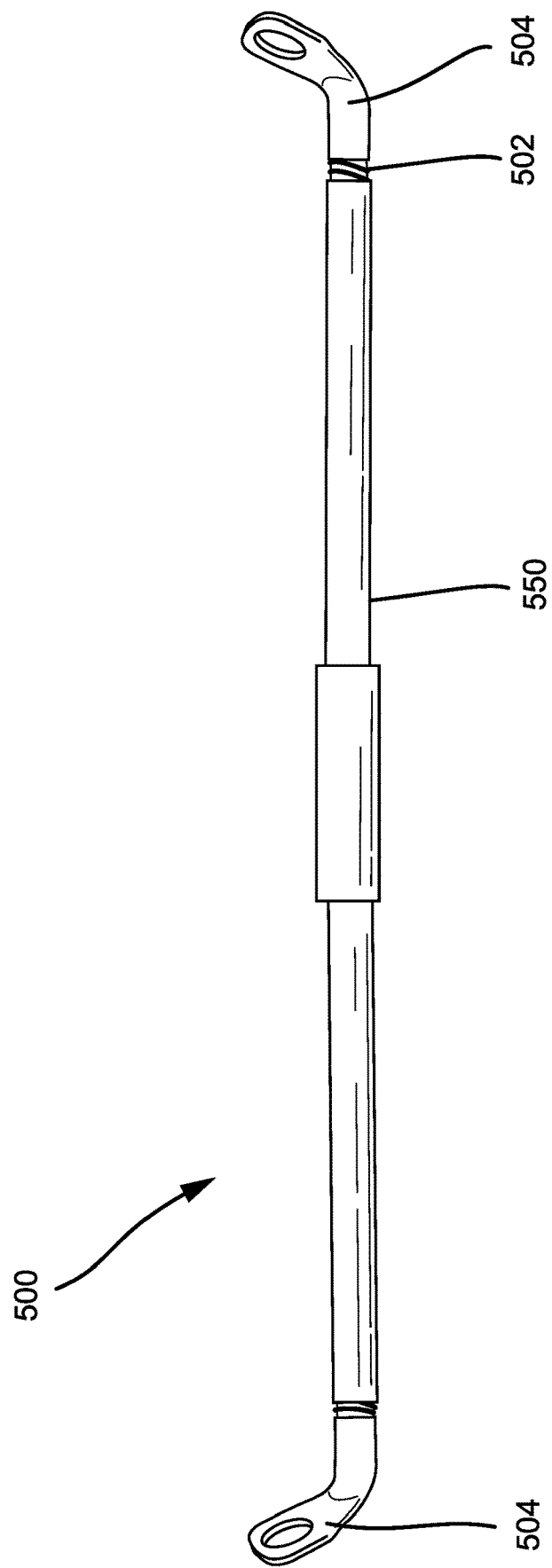
FIG. 18 is a side view of a further embodiment of a sealed stranded wire in accordance with the principles of the present disclosure.

FIG. 18 shows another alternative embodiment of a sealed stranded wire assembly 500. In the example of FIG. 18, the sealed stranded wire assembly 500 includes a first length of stranded wire 501 terminated at a first end by an eyelet 504 and terminated at a second end by a tubular conductive member 530 (shown in FIG. 19). Similarly, the sealed stranded wire assembly 500 also includes a second length of stranded wire 502 terminated at a first end by an eyelet 504 and terminated at a second end by a tubular conductive member 530. In some examples, the first length of stranded wire 501 and the second length of stranded wire 502 are substantially similar to the length of stranded wire 102, as described with reference to FIGS. 1-3, and can be, for example, a bundle of wires that are twisted or braided together. In some examples, such as the example of FIG. 18, the sealed stranded wire assembly 500 includes a seal 550 such as a heat shrink sleeve. However, in other examples, the seal 550 is in the form of a plastic dip coating that can be used in place of a heat shrink sleeve.

Figure 19:
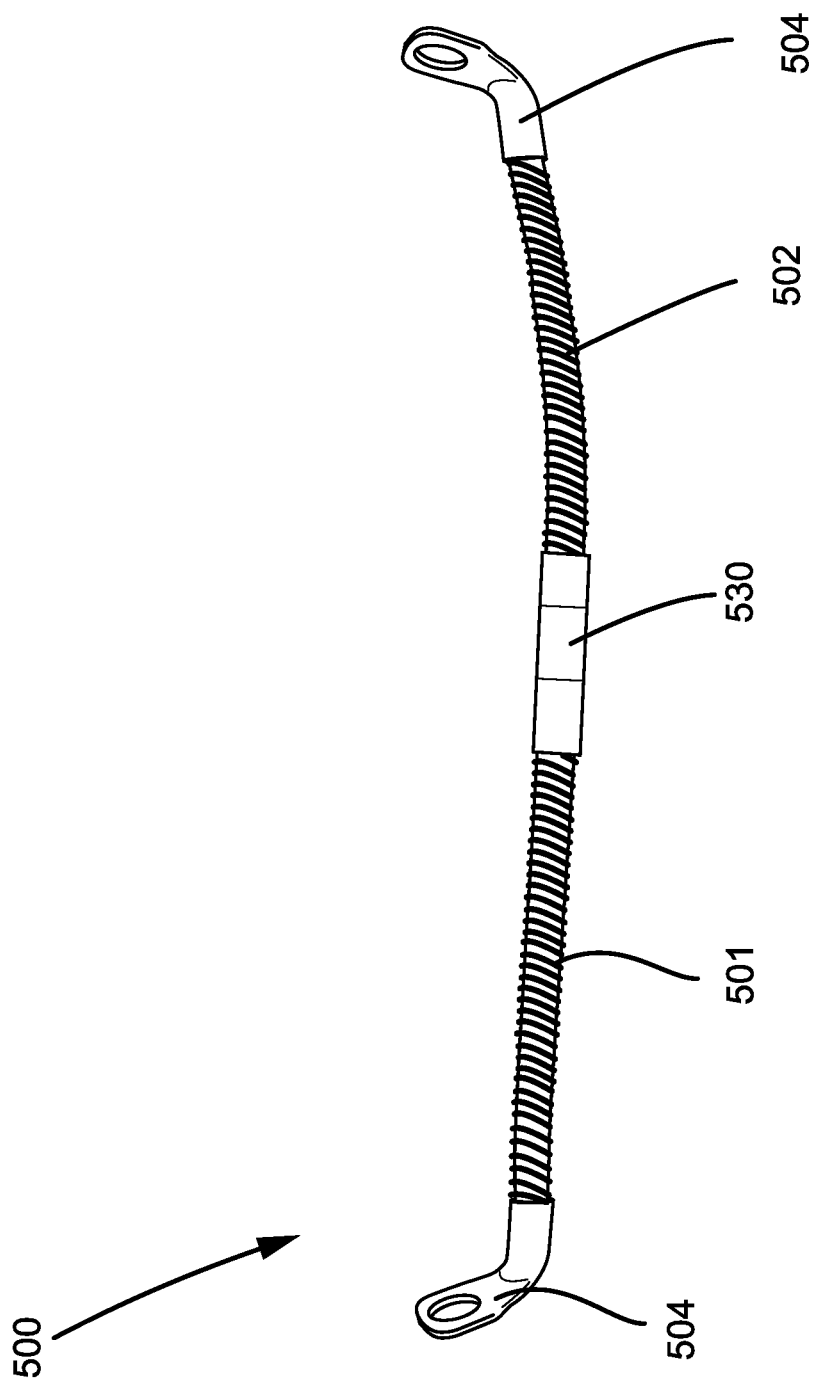
FIG. 19 is a side view of the sealed stranded wire of FIG. 18 with the sleeve removed.

FIG. 19 shows sealed stranded wire assembly 500 with the seal 550 removed. In the example of FIG. 19, the tubular conductive member 530 functions similarly to the tubular conductive member 130 discussed above with reference to FIGS. 1-3 and is attached to the first length of stranded wire 501 and the second length of stranded wire 502 in substantially the same way that the tubular conductive member 130 is attached to the stranded wire 102, as discussed with reference to FIGS. 1-3. Because each of the first length of stranded wire 501 and the second length of stranded wire 502 terminates at the tubular conductive member 530, liquids, dust, or other contaminants are prevented from traveling along the length of the sealed stranded wire assembly 500 from the first length of stranded wire 501 to the second length of stranded wire 502.

In the example of FIG. 19, the tubular conductive member 530 functions to receive both of the first length of stranded wire 501 and the second length of stranded wire 502 within it. The tubular conductive member 530 is crimped onto the first length of stranded wire 501 and the second length of stranded wire 502 at each end.

Figure 20:
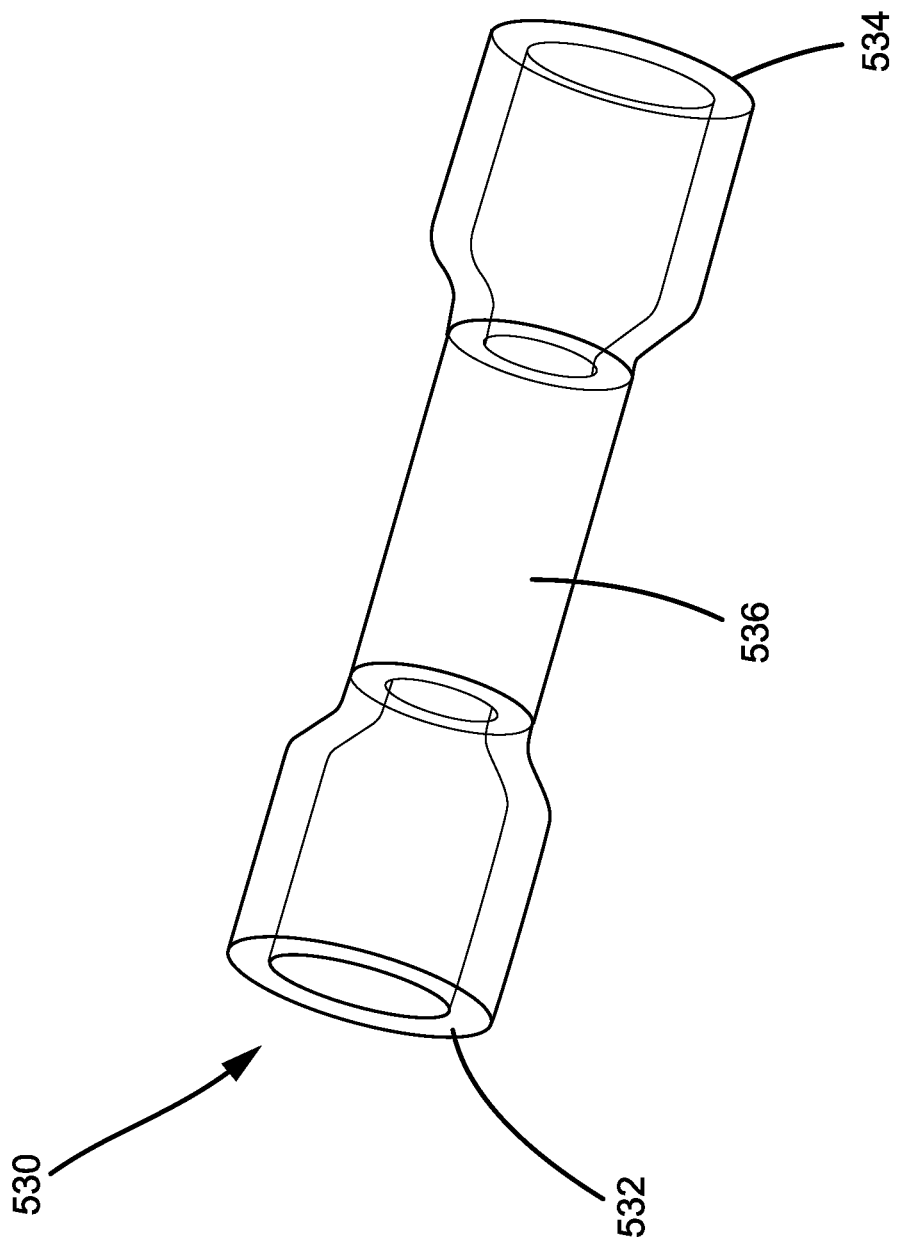
FIG. 20 is a perspective view of another embodiment of a tubular conductive member in accordance with the principles of the present disclosure.
Figure 21:
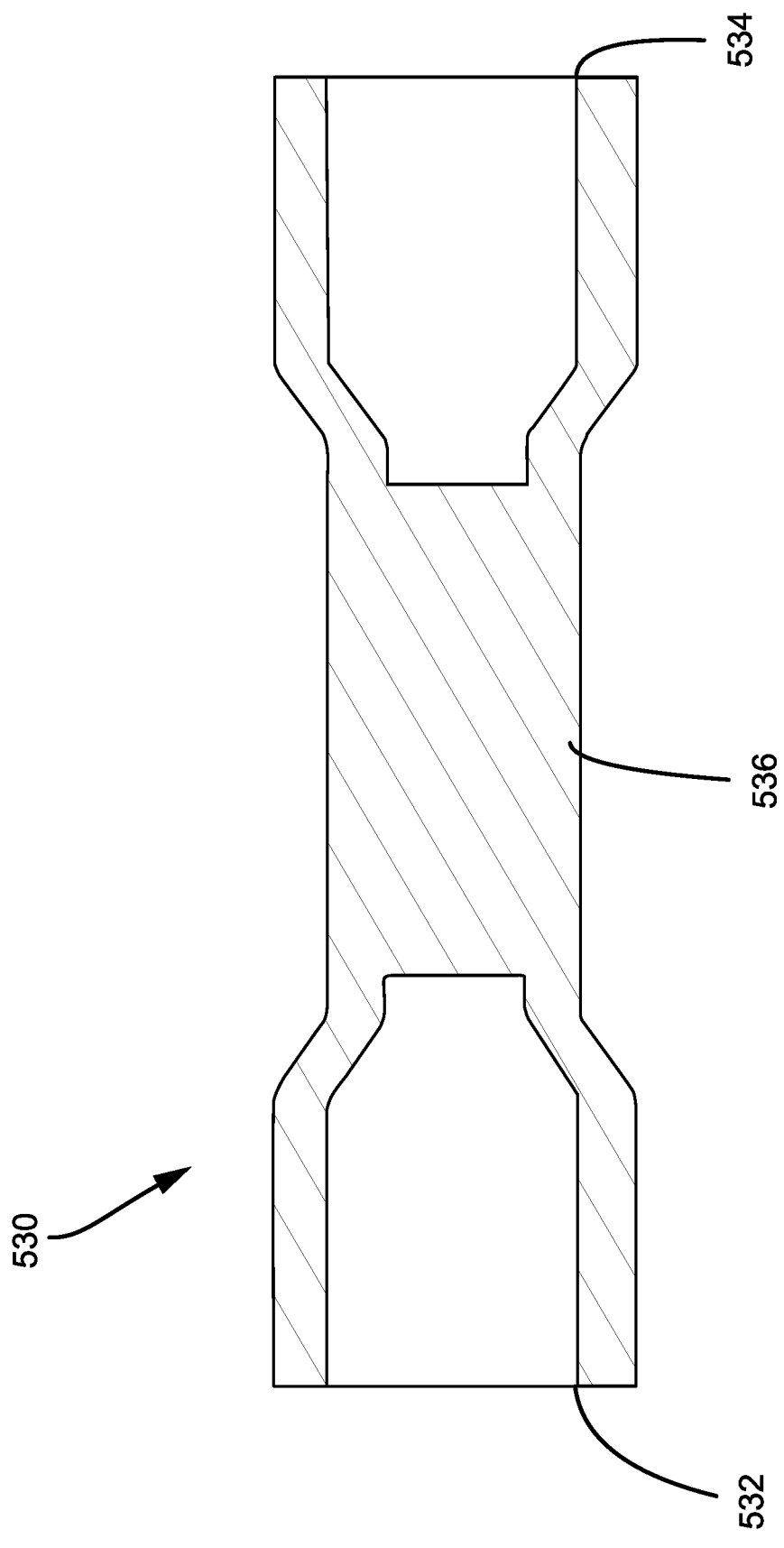
FIG. 21 is a cross-sectional view of the tubular conductive member of FIG. 20.

FIGS. 20-21 show an example tubular conductive member 530 that can be used to connect the first length of stranded wire 501 and the second length of stranded wire 502. The example tubular conductive member 530 includes a first end 532, a second end 534, and a solid middle section 536. In some examples, the diameter of the first end of the tubular conductive member 530 is approximately equal to the diameter of the second end 134. In some examples, the first length of stranded wire 501 is inserted into an opening at the first end 532 and the second length of stranded wire 502 is inserted into an opening at the second end 534. In some examples, the first end 532 is sized to accommodate a #6AWG braided wire, and the second end is also sized to accommodate a #6AWG braided wire.

Figure 24:
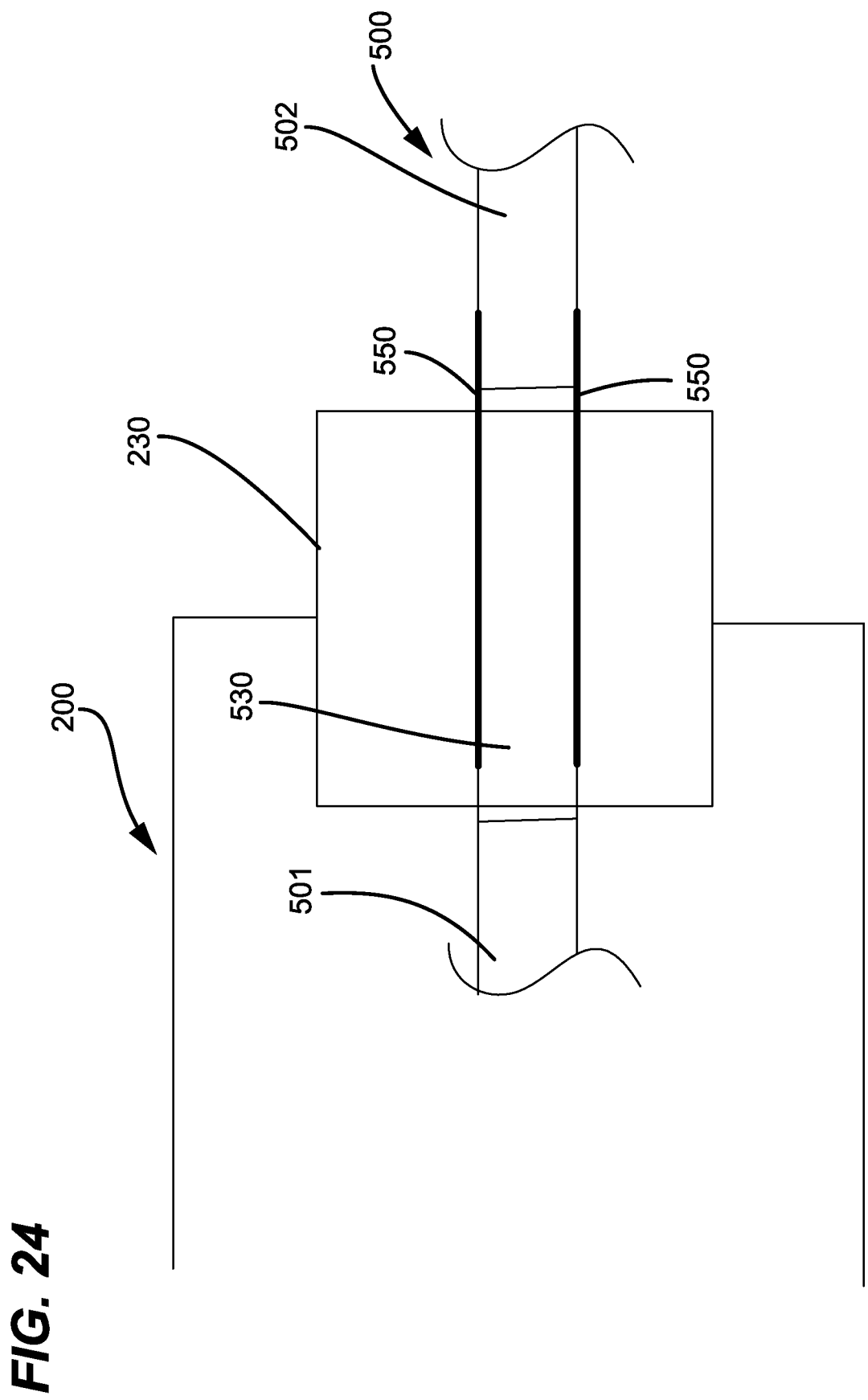
FIG. 24 is a further diagram of a telecommunications enclosure with a sealed stranded wire routed through a gel sealing unit.

The solid middle section 536 can vary in length. In some examples, the length of the solid middle section 536 is in a range from about 10 mm to about 100 mm (or from 10 mm to 100 mm). In other examples, the length of the solid middle section 536 is in a range from about 10 mm to about 35 mm (or from 10 mm to 35 mm). In some examples, the length of the solid middle section 536 has a length that is equal to or greater than the length of the gel sealing unit 230. In such examples, the tubular conductive member 530 could be laid across the gel sealing unit 230 so that one end of the tubular conductive member 530 extends out of the gel sealing unit 230 into the interior of the enclosure 200 and the other end of the tubular conductive member 530 extends out of the gel sealing unit 230 into the exterior of the enclosure 200 (as depicted in FIG. 24). In such examples, the seal formed between the gel sealing unit 230 and the tubular conductive member 530 is made solely on the solid middle section 536. In some examples, the diameter of the solid middle section 536 is smaller than the diameter of the first end 532 and the second end 534. In other examples, the diameter of the solid middle section 536 is approximately equal to the diameter of the first end 532 and the second end 534. In some examples, the diameter of the solid middle section 536 is approximately equal to the diameter of the first length of stranded wire 501 and the second length of stranded wire 502. In some examples, the diameter of the solid middle section 536 is at least equal to or greater than the smaller of the diameter of the first length of stranded wire 501 or the diameter of the second length of stranded wire 502 so that the solid middle section 536 is able to pass an equal rated current of the smaller of the first length of stranded wire 501 or the second length of stranded wire 502. In some examples, additional material may be added around the length of the tubular conductive member 530 under the seal 550 to indicate the location of the solid portion once the seal 550 is applied over the tubular conductive member 530, the first length of stranded wire 501, and the second length of stranded wire 502.

As noted above with reference to FIG. 18, a seal 550 may be applied along the first length of stranded wire 501 and the second length of stranded wire 502. In some examples, the seal 550 is applied along the entire length of both of the first length of stranded wire 501 and the second length of stranded wire 502. In other examples, the seal 550 is applied along a portion of one of the first length of stranded wire 501 and the second length of stranded wire 502. For example, the seal 550 may be applied only along the first length of stranded wire 501 or only along the second length of stranded wire 502. In some examples, the seal 550 is also applied along the tubular conductive member 530. In some examples, due to the presence of the tubular conductive member 530, the diameter of the sealed stranded wire assembly 500 is larger at the point where the tubular conductive member is 530 than where the first length of stranded wire 501 and the second length of stranded wire 502 are arranged.

In some examples, the sealed stranded wire assembly 500 is used with an enclosure 200 to prevent liquid, dust, or other contaminants from traveling along the first length of stranded wire 501 into the interior of the enclosure 200. Likewise, the sealed stranded wire assembly 100 may be used with an enclosure 200 to prevent liquid, dust, or other contaminants from traveling along the length of the sealed stranded wire assembly. Although reference is made in FIGS. 22-24 to the sealed stranded wire assembly 500, it should be understood that the sealed stranded wire assembly 100 may also be employed in analogous configurations.

Figure 22:
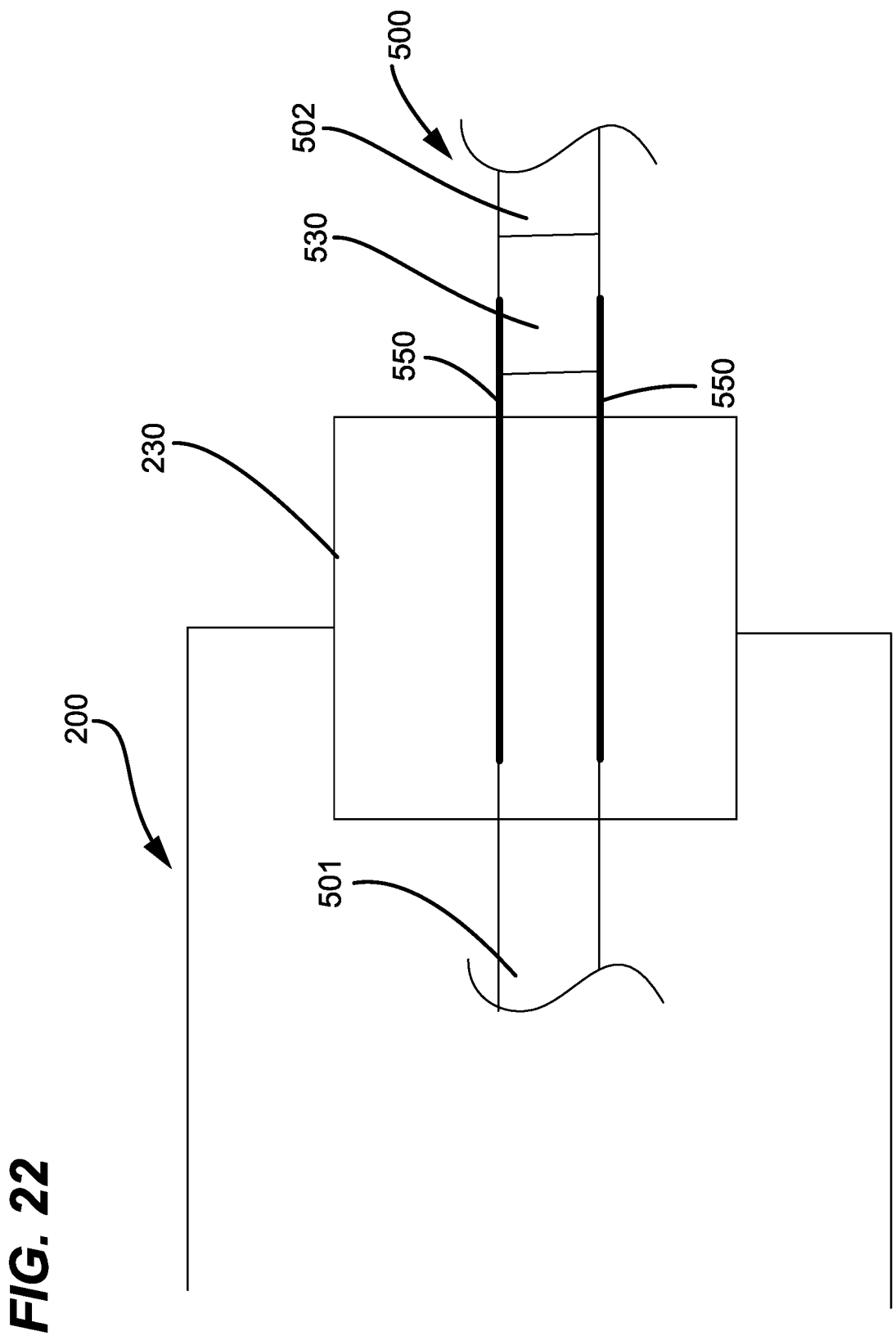
FIG. 22 is a diagram of a telecommunications enclosure with a sealed stranded wire routed through a gel sealing unit.

FIG. 22 shows an example sealed stranded wire assembly 500 that is routed into an enclosure 200 through a gel sealing unit 230. In the example of FIG. 22, the sealed stranded wire assembly 500 is routed straight through the gel sealing unit 230 so that the first length of stranded wire 501 of the sealed stranded wire assembly 500 extends from the outside of the enclosure 200, through the gel sealing unit 230, and into the enclosure 200. In the example of FIG. 22, the tubular conductive member 530 is positioned outside of the enclosure 200 adjacent to the gel sealing unit 230 and stops moisture from traveling along the second length of stranded wire 502 into the first length of stranded wire 501 and into the enclosure 200.

In the example of FIG. 22, the sealed stranded wire assembly 500 is shown with seal 550 included along a portion of the length of the sealed stranded wire assembly 500. In some examples, the seal 550 is provided along the entire length of the sealed stranded wire assembly. In other examples, the seal 550 is provided along less than the entire length of the sealed stranded wire assembly. In some examples, when configured in the orientation of FIG. 22, the seal 550 is only provided along the sealed stranded wire assembly 500 along the first length of stranded wire 501 between the tubular conductive member 530 and where the gel sealing unit 230 forms a seal with the sealed stranded wire assembly 500.

Figure 23:
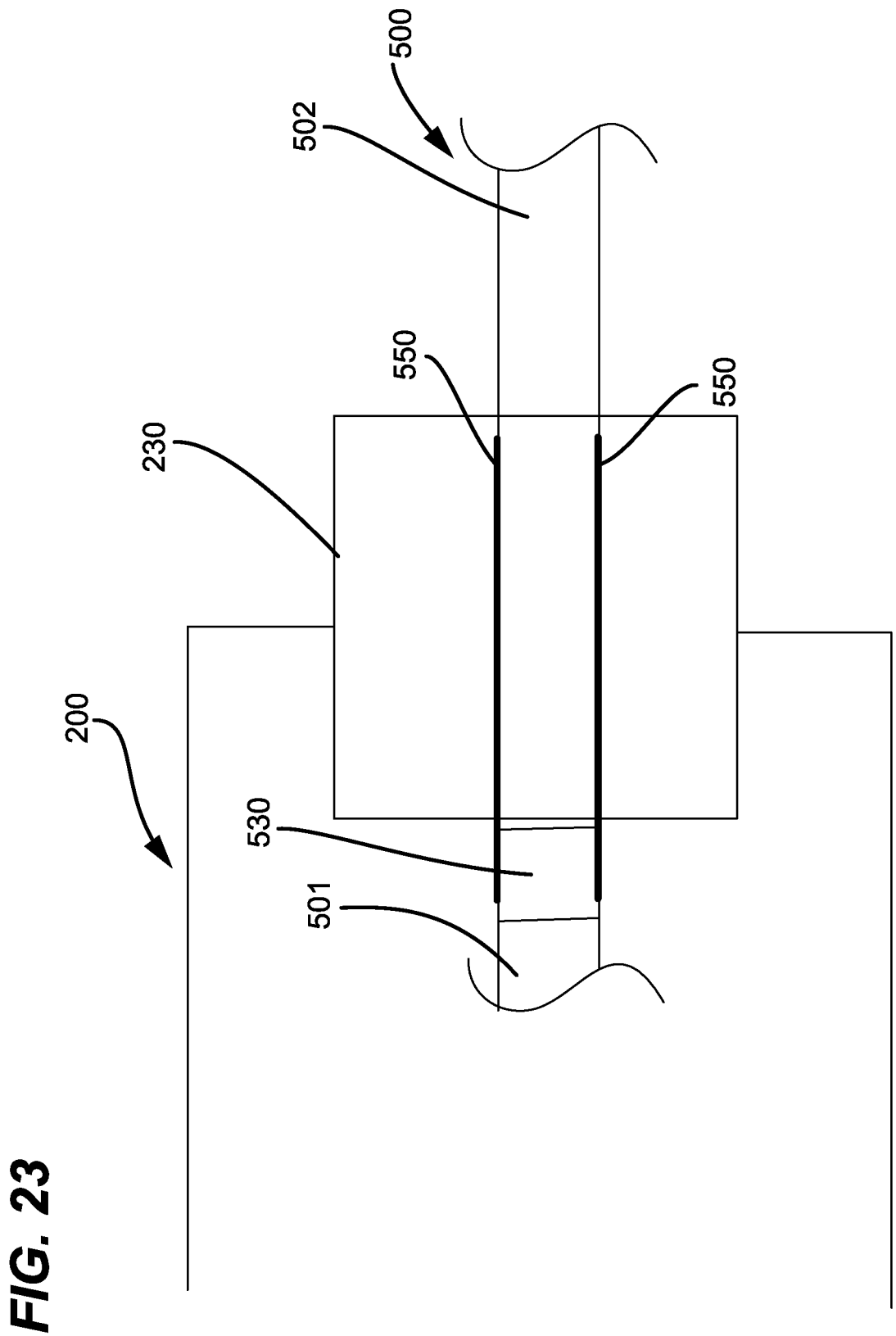
FIG. 23 is another diagram of a telecommunications enclosure with a sealed stranded wire routed through a gel sealing unit.

FIG. 23 shows another example sealed stranded wire assembly 500 that is routed into an enclosure 200 through a gel sealing unit 230. In the example of FIG. 23, the sealed stranded wire assembly 500 is routed straight through the gel sealing unit 230 so that the first length of stranded wire 501 of the sealed stranded wire assembly 500 extends within the enclosure 200 and terminates within enclosure 200 adjacent to the gel sealing unit 230. The tubular conductive member 530 is positioned within the enclosure 200 adjacent to the gel sealing unit 230 and stops moisture from traveling along the second length of stranded wire 502 further into the enclosure 200. The second length of stranded wire 502 extends from the outside of the enclosure, through the gel sealing unit 230, and into the enclosure.

In the example of FIG. 23, the sealed stranded wire assembly 500 is shown with seal 550 included along a portion of the length of the sealed stranded wire assembly 500. In some examples, the seal 550 is provided along the entire length of the sealed stranded wire assembly. In other examples, the seal 550 is provided along less than the entire length of the sealed stranded wire assembly. In some examples, when configured in the orientation of FIG. 23, the seal 550 is only provided along the sealed stranded wire assembly 500 along the second length of stranded wire 502 between the tubular conductive member 530 and where the gel sealing unit 230 forms a seal with the sealed stranded wire assembly 500.

FIG. 24 shows another example sealed stranded wire assembly 500 that is routed into an enclosure 200 through a gel sealing unit 230. In the example of FIG. 24, the sealed stranded wire assembly 500 is routed straight through the gel sealing unit 230 so that the first length of stranded wire 501 of the sealed stranded wire assembly 500 extends within the enclosure 200 and terminates within enclosure 200 adjacent to the gel sealing unit 230. The tubular conductive member 530 is positioned partially within the enclosure 200, extends through the gel sealing unit 230, and terminates just outside the gel sealing unit 230. The second length of stranded wire 502 connects to the tubular conductive member 530 outside of the enclosure 200 adjacent to the gel sealing unit 230. The tubular conductive member 530 stops moisture from traveling along the second length of stranded wire 502 into the enclosure 200. In some examples, the solid middle section 536 of the tubular conductive member 530 extends through the entire gel sealing unit 230.

In the example of FIG. 24, the sealed stranded wire assembly 500 is shown with seal 550 included along a portion of the length of the sealed stranded wire assembly 500. In some examples, the seal 550 is provided along the entire length of the sealed stranded wire assembly. In other examples, the seal 550 is provided along less than the entire length of the sealed stranded wire assembly. In some examples, when configured in the orientation of FIG. 24, no seal 550 is provided.

In some examples, a variation of the example of FIG. 24 is used. In these examples, the tubular conductive member 530 is oriented so that it extends only partially through the gel sealing unit 230. For example, the tubular conductive member 530 is oriented so that the first end of the tubular conductive member 530 terminates outside of the enclosure 200 and the second of the tubular conductive member 530 terminates within the gel sealing unit 230. In other examples, the tubular conductive member 530 is oriented so that the first end of the tubular conductive member 530 terminates within the gel sealing unit 230 and the second end of the tubular conductive member 530 terminates within the enclosure 200.

Aspects of the Invention

One aspect of the invention includes a grounding wire assembly comprising: a stranded wire having a first end and a second end, the stranded wire having a stranded conductive core and an insulating jacket covering at least a portion of the stranded core between the first and second ends, the first end having an exposed end of stranded conductive core; a solid wire having a first end and second end, the solid wire being conductive, the solid wire having an exposed conductive outer surface portion; a tubular conductive member having opposite open ends; the first end of the stranded wire having the exposed end of stranded conductive core and the second end of the solid wire each positioned in opposite open ends of the tubular conductive member, wherein the tubular conductive member is conductively attached to the exposed end of stranded conductive core of the stranded wire and to the solid wire; and a sleeve of heat shrink tubing positioned over the tubular conductive member, the sleeve also extending a first length over a portion of the exposed conductive outer surface portion of the solid wire, the sleeve also extending a second length over a portion of the insulating jacket of the stranded wire, wherein the sleeve forms a seal around the tubular conductive member, the first length over the solid wire, and the second length over the insulating jacket of the stranded wire.

Another aspect of the invention includes any of the above aspects, wherein the stranded wire is terminated at the second end of the stranded wire by an eyelet.

Another aspect of the invention includes any of the above aspects, wherein the sleeve includes a coating of adhesive on an inner surface of the heat shrink tubing.

Another aspect of the invention includes any of the above aspects, wherein the adhesive is heat activated.

Another aspect of the invention includes any of the above aspects, wherein the tubular conductive member is crimped onto the exposed end of the stranded wire and second end of the solid wire.

Another aspect of the invention includes any of the above aspects, wherein the tubular conductive member is conductively attached to at least one of the exposed end of the stranded wire and the second end of the solid wire by solder.

Another aspect of the invention includes a telecommunications enclosure comprising: an enclosure including a housing including a gel sealing block; the gel sealing block providing an environmentally sealed pathway for cable to pass between the enclosure and an exterior environment; at least one cable passing through the gel sealing block; a stranded grounding wire routed through the gel sealing block; a first end of the stranded grounding wire extending into the exterior environment; the stranded grounding wire conductively attached at a second end to a mounting position inside the housing; a solid wire having a first end and second end, the solid wire being conductive, the solid wire having an exposed conductive outer surface portion; a tubular conductive member having opposite open ends; the first end of the stranded grounding wire having the exposed end of stranded conductive core and the second end of the solid wire each positioned in opposite open ends of the tubular conductive member, wherein the tubular conductive member is conductively attached to the exposed end of stranded conductive core of the stranded grounding wire and to the solid wire; and a sleeve of heat shrink tubing positioned over the tubular conductive member, the sleeve also extending a first length over a portion of the exposed conductive outer surface portion of the solid wire, the sleeve also extending a second length over a portion of the insulating jacket of the stranded grounding wire, wherein the sleeve forms a seal around the tubular conductive member, the first length over the solid wire, and the second length over the insulating jacket of the stranded wire.

Another aspect of the invention includes any of the above aspects, wherein the stranded grounding wire is terminated at the second end by an eyelet.

Another aspect of the invention includes any of the above aspects, wherein the sleeve includes a coating of adhesive on an inner surface of the heat shrink tubing.

Another aspect of the invention includes any of the above aspects, wherein the adhesive is heat activated.

Another aspect of the invention includes any of the above aspects, wherein the tubular conductive member is crimped onto the exposed end of the stranded wire and second end of the solid wire.

Another aspect of the invention includes a method of grounding a telecommunications enclosure and cable comprising: providing an enclosure including a housing including a first seal; the first seal providing an environmentally sealed pathway for a cable to pass between the enclosure and an exterior environment; passing at least one cable through the first seal; passing a stranded grounding wire through the first seal; a first end of the stranded grounding wire extending into the exterior environment; the stranded grounding wire conductively attached at a second end to the cable inside the housing; a solid wire having a first end and second end, the solid wire being conductive, the solid wire having an exposed conductive outer surface portion, the first end of the stranded grounding wire electrically connected to the second end of the solid wire; a second seal provided over the first end of the stranded grounding wire and the second end of the solid wire, the second seal positioned in the exterior environment; connecting the solid wire to a grounding path in the exterior environment.

Another aspect of the invention includes a grounding wire assembly comprising: a stranded wire having a first end and a second end, the stranded wire having a stranded conductive core and an insulating jacket covering at least a portion of the stranded core between the first and second ends, the first end having an exposed end of stranded conductive core; a solid wire having a first end and second end, the solid wire being conductive, the solid wire having an exposed conductive outer surface portion; a conductive connection between the first end of the stranded wire having the exposed end of stranded conductive core and the second end of the solid wire; and a protective seal extending a first length over a portion of the exposed conductive outer surface portion of the solid wire, the protective seal also extending a second length over a portion of the insulating jacket of the stranded wire, wherein the protective seal forms an environmental seal around the conductive connection, the first length over the solid wire, and the second length over the insulating jacket of the stranded wire.

Another aspect of the invention includes a telecommunications enclosure comprising: an enclosure including a housing including a first seal; the first seal providing an environmentally sealed pathway for cable to pass between the enclosure and an exterior environment; at least one cable passing through the first seal; a stranded grounding wire routed through the first; a first end of the stranded grounding wire extending into the exterior environment; the stranded grounding wire conductively attached at a second end to a mounting position inside the housing; a solid wire having a first end and second end, the solid wire being conductive, the solid wire having an exposed conductive outer surface portion; the first end of the stranded grounding wire having the exposed end of stranded conductive core and the second end of the solid wire each conductively connected; and a protective seal extending a first length over a portion of the exposed conductive outer surface portion of the solid wire, the protective seal also extending a second length over a portion of the insulating jacket of the stranded wire, wherein the protective seal forms an environmental seal around the conductive connection, the first length over the solid wire, and the second length over the insulating jacket of the stranded wire.

Another aspect of the invention includes a telecommunications enclosure comprising an enclosure including a housing including a gel sealing block; the gel sealing block providing an environmentally sealed pathway for cable to pass between the enclosure and an exterior environment; at least one cable passing through the gel sealing block; a length of stranded grounding wire routed within the enclosure; the length of stranded grounding wire having a stranded conductive core and being conductively attached at a second end to a mounting position inside the housing; a second length of wire having a first end and second end, the second length of wire being conductive, the second length of wire having a conductive core; a solid conductive portion having opposite ends; the first end of the length of stranded grounding wire and the second end of the second length of wire each contacting opposite ends of the solid conductive portion, wherein the solid conductive portion is conductively attached to the stranded conductive core of the length stranded grounding wire and to the conductive core of the second length of wire; and the solid conductive portion being positioned within the gel sealing block, the gel sealing block forming a seal around the solid portion.

Another aspect of the invention includes any of the above aspects, wherein the second length of wire includes a length of stranded wire.

Another aspect of the invention includes any of the above aspects, wherein the second length of wire includes a length of solid wire.

Another aspect of the invention includes a grounding wire assembly comprising: a first length of stranded wire having a first end and a second end, the first length of stranded wire having a stranded conductive core with voids arranged between the strands; a second length of stranded wire having a first end and second end, the second length of stranded wire having a stranded conductive core with voids arranged between the strands; a middle length of stranded wire positioned between the first length of stranded wire and the second length of stranded wire, the middle length of stranded wire having a stranded conductive core with blocking material that fills the voids between the strands; the first end of the first length of stranded wire and the second end of the second length of wire each contacting opposite ends of the middle portion, wherein the middle portion is conductively attached to the stranded conductive core of the first length of stranded wire and to the stranded conductive core of the second length of wire.

Another aspect of the invention includes any of the above aspects, further comprising a seal over the middle length of stranded wire, the seal also extending over a portion of the first length of stranded wire, the seal also extending over a portion of the second length of stranded wire, wherein the seal forms a sealed connection around the middle length of stranded wire, the first length of stranded wire, and the second length of stranded wire.

Another aspect of the invention includes a grounding wire assembly comprising: a first length of stranded wire having a first end and a second end, the first length of stranded wire having a stranded conductive core with voids arranged between the strands; a second length of stranded wire having a first end and second end, the second length of stranded wire having a stranded conductive core with voids arranged between the strands; a tubular conductive member having opposite open ends; the first end of the first length of stranded wire and the second end of the second length of stranded wire each positioned in opposite open ends of the tubular conductive member, wherein the tubular conductive member is conductively attached to the first length of stranded wire and the second length of stranded wire.

Another aspect of the invention includes any of the above aspects, further comprising a seal over the tubular conductive member, the seal also extending over a portion of the first length of stranded wire, the seal also extending over a portion of the second length of stranded wire, wherein the seal forms a sealed connection around the tubular conductive member, the first length of stranded wire, and the second length of stranded wire.

Although the invention has been herein described in what is perceived to be the most practical and preferred embodiments, the invention is not intended to be limited to the specific embodiments set forth above. Rather, modifications may be made by one of skill in the art of the invention without departing from the spirit or intent of the invention.

What is claimed is:

1. A grounding wire assembly comprising:
   a first length of stranded wire having a first end and a second end, the first length of stranded wire having a stranded conductive core;
   a second length of wire having a first end and a second end, the second length of wire having a conductive core;
   a monolithic tubular conductive member including a first end with a first opening, a second end with a second opening opposite the first end, and a solid middle portion;
   the first end of the first length of stranded wire being inserted into the first opening and the first end of the second length of wire being inserted into the second opening of the tubular conductive member, wherein the tubular conductive member is conductively attached to the stranded conductive core of the first length of stranded wire and to the conductive core of the second length of wire; and
   a seal extending over the tubular conductive member, the seal also extending a first length over a portion of the second length of wire, the seal also extending a second length over a portion of the first length of stranded wire, wherein the seal forms a sealed connection around the tubular conductive member, the first length of stranded wire, and the second length of wire.

2. The grounding wire assembly of claim 1, wherein the second length of wire includes a length of stranded wire.

3. The grounding wire assembly of claim 1, wherein the second length of wire includes a length of solid wire.

4. The grounding wire assembly of claim 1, wherein the tubular conductive member is crimped onto the first end of the first length of stranded wire and the first end of the second length of wire.

5. The grounding wire assembly of claim 1, wherein the seal includes a heat shrink sleeve.

6. The grounding wire assembly of claim 1, wherein the seal includes a plastic dip coating.

7. The grounding wire assembly of claim 1, wherein the first length of stranded wire and the second length of wire include #6 AWG stranded wires.

8. A telecommunications enclosure comprising:
   an enclosure including a housing including a gel sealing block;
   the gel sealing block providing an environmentally sealed pathway for cable to pass between the enclosure and an exterior environment;
   at least one cable passing through the gel sealing block;
   a first length of stranded wire routed within the enclosure for grounding the enclosure;
   the first length of stranded wire having a stranded conductive core and being conductively attached at a second end to a mounting position inside the housing;
   a second length of wire having a first end and a second end, the second length of wire being conductive, the second length of wire having a conductive core;
   a monolithic tubular conductive member including a first end with a first opening, a second end with a second opening opposite the first end, and a solid middle portion;
   the first end of the first length of stranded wire being inserted into the first opening and the first end of the second length of wire being inserted into the second opening of the tubular conductive member, wherein the tubular conductive member is conductively attached to the stranded conductive core of the first length of stranded wire and to the conductive core of the second length of wire; and
   a seal over the tubular conductive member, the seal also extending a first length over a portion of the first length of stranded wire, the seal also extending a second length over a portion of the second length of wire, wherein the seal forms a sealed connection around the tubular conductive member, the first length of the first length of stranded wire, and the second length of the second length of wire.

9. The telecommunications enclosure of claim 8, wherein the second length of wire includes a length of stranded wire.

10. The telecommunications enclosure of claim 8, wherein the second length of wire includes a length of solid wire.

11. The telecommunications enclosure of claim 8, wherein the tubular conductive member is crimped onto the first end of the first length of stranded wire and the first end of the second length of wire.

12. The telecommunications enclosure of claim 8, wherein the seal includes a heat shrink sleeve.

13. The telecommunications enclosure of claim 8, wherein the seal includes a plastic dip coating.

14. The telecommunications enclosure of claim 8, wherein the first length of stranded wire and the second length of wire include #6 AWG stranded wires.

15. A grounding wire assembly comprising:
   a first length of stranded wire having a first end and a second end, the first length of stranded wire having a stranded conductive core;
   a second length of solid wire having a first end and a second end, the second length of solid wire having a solid conductive core;
   a tubular conductive member extending between a first end and a second end opposite the first end, the tubular conductive member having an opening extending from the first end to the second end;
   the first end of the first length of stranded wire extending into the opening at the first end of the tubular conductive member and the first end of the second length of solid wire extending into the opening at the second end of the tubular conductive member, wherein the tubular conductive member is conductively attached to the stranded conductive core of the first length of stranded wire and to the solid conductive core of the second length of solid wire; and
   a seal extending over the tubular conductive member, the seal also extending a first length over a portion of the second length of solid wire, the seal also extending a second length over a portion of the first length of stranded wire, wherein the seal forms a sealed connection around the tubular conductive member, the first length of stranded wire, and the second length of solid wire.

16. The grounding wire assembly of claim 15, wherein each of the first end of the first length of stranded wire and the first end of the second length of solid wire are inserted into opposite sides of the tubular conductive member and the tubular conductive member is crimped onto the first end of the first length of stranded wire and the first end of the second length of solid wire.

17. The grounding wire assembly of claim 15, wherein the seal includes a heat shrink sleeve.

18. The grounding wire assembly of claim 15, wherein the seal includes a plastic dip coating.

19. The grounding wire assembly of claim 15, wherein the first length of stranded wire includes a #6 AWG stranded wire.

20. The grounding wire assembly of claim 15 wherein the first end of the tubular conductive member has a larger diameter than the second end of the tubular conductive member.

21. The grounding wire assembly of claim 15, wherein the first end of the tubular conductive member is sized to accommodate a #6 AWG braided wire and wherein the second end of the tubular conductive member is sized to accommodate a #6 AWG solid wire.

22. A telecommunications enclosure comprising:
an enclosure including a housing including a gel sealing block;
the gel sealing block providing an environmentally sealed pathway for cable to pass between the enclosure and an exterior environment;
at least one cable passing through the gel sealing block;
a first length of stranded wire routed within the enclosure for grounding the enclosure;
the first length of stranded wire having a stranded conductive core and being conductively attached at a second end to a mounting position inside the housing;
a second length of solid wire having a first end and a second end, the second length of solid wire being conductive, the second length of solid wire having a conductive core;
a tubular conductive member extending between a first end and a second end opposite the first end, the tubular conductive member having an opening extending from the first end to the second end;
the first end of the first length of stranded wire extending into the opening at the first end of the tubular conductive member and the first end of the second length of solid wire extending into the opening at the second end of the tubular conductive member, wherein the tubular conductive member is conductively attached to the stranded conductive core of the first length of stranded wire and to the conductive core of the second length of solid wire; and
a seal over the tubular conductive member, the seal also extending a first length over a portion of the first length of stranded wire, the seal also extending a second length over a portion of the second length of solid wire, wherein the seal forms a sealed connection around the tubular conductive member, the first length of the first length of stranded wire, and the second length of the second length of solid wire.

23. The telecommunications enclosure of claim 22, wherein the tubular conductive member is a tubular conductive member, and wherein each of the first end of the first length of stranded wire and the first end of the second length of solid wire are inserted into opposite sides of the tubular conductive member and the tubular conductive member is crimped onto the first end of the first length of stranded wire and the first end of the second length of solid wire.

24. The telecommunications enclosure of claim 22, wherein the seal includes a heat shrink sleeve.

25. The telecommunications enclosure of claim 22, wherein the seal includes a plastic dip coating.

26. The telecommunications enclosure of claim 22, wherein the first length of stranded wire includes a #6 AWG stranded wire.

27. The telecommunications enclosure of claim 22, wherein the first end of the tubular conductive member has a larger diameter than the second end of the tubular conductive member.

28. The telecommunications enclosure of claim 22, wherein the first end of the tubular conductive member is sized to accommodate a #6 AWG braided wire and wherein the second end of the tubular conductive member is sized to accommodate a #6 AWG solid wire.

29. A grounding wire assembly comprising:
a length of stranded wire having a continuous stranded conductive core, the length of stranded wire comprising:
a first stranded portion;
a second stranded portion; and
a solid portion, the solid portion comprising a portion of the continuous stranded conductive core and a blocking material that fills voids within the portion of the continuous stranded conductive core, the solid portion being located between the first stranded portion and the second stranded portion; and
a seal extending over the solid portion, the seal also extending a first length over the first stranded portion, the seal also extending a second length over the second stranded portion, wherein the seal forms a sealed connection around the solid portion, the first stranded portion, and the second stranded portion.

30. The grounding wire assembly of claim 29, wherein the blocking material comprises solder.

31. The grounding wire assembly of claim 29, wherein the blocking material comprises a low viscosity polymer.

32. The grounding wire assembly of claim 29, wherein the blocking material comprises grease.

33. The grounding wire assembly of claim 29, wherein the blocking material comprises adhesive.

34. The grounding wire assembly of claim 29, wherein the seal includes a heat shrink sleeve.

35. The grounding wire assembly of claim 29, wherein the seal includes a plastic dip coating.

36. The grounding wire assembly of claim 29, wherein the length of stranded wire includes a #6 AWG stranded wire.

37. A telecommunications enclosure comprising:
an enclosure including a housing including a gel sealing block;
the gel sealing block providing an environmentally sealed pathway for cable to pass between the enclosure and an exterior environment;
at least one cable passing through the gel sealing block;
a length of stranded wire having a continuous stranded conductive core, the length of stranded wire comprising:
a first stranded portion;
a second stranded portion; and
a solid portion, the solid portion comprising a portion of the continuous stranded conductive core and a blocking material that fills voids within the portion of the continuous stranded conductive core, the solid portion being located between the first stranded portion and the second stranded portion; and a seal extending over the solid portion, the seal also extending a first length over the first stranded portion, the seal also extending a second length over the second stranded portion, wherein the seal forms a sealed connection around the solid portion, the first stranded portion, and the second stranded portion.

38. The telecommunications enclosure of claim 37, wherein the blocking material comprises solder.

39. The telecommunications enclosure of claim 37, wherein the blocking material comprises grease.

40. The telecommunications enclosure of claim 37, wherein the blocking material comprises an adhesive.

41. The telecommunications enclosure of claim 37, wherein the seal includes a heat shrink sleeve.

42. The telecommunications enclosure of claim 37, wherein the seal includes a plastic dip coating.

43. The telecommunications enclosure of claim 37, wherein the length of stranded wire includes a #6 AWG stranded wire.

\* \* \* \* \*